United States Patent
Ishikawa et al.

(10) Patent No.: US 8,487,709 B2
(45) Date of Patent: Jul. 16, 2013

(54) OSCILLATOR CIRCUIT

(75) Inventors: Shinji Ishikawa, Osaka (JP); Ichiro Yamane, Kyoto (JP)

(73) Assignee: Panasonic Corporation, Osaka (JP)

( * ) Notice: Subject to any disclaimer, the term of this patent is extended or adjusted under 35 U.S.C. 154(b) by 96 days.

(21) Appl. No.: 13/122,694

(22) PCT Filed: Jul. 22, 2010

(86) PCT No.: PCT/JP2010/004685
§ 371 (c)(1),
(2), (4) Date: Aug. 19, 2011

(87) PCT Pub. No.: WO2011/089662
PCT Pub. Date: Jul. 28, 2011

(65) Prior Publication Data
US 2011/0291767 A1    Dec. 1, 2011

(30) Foreign Application Priority Data
Jan. 25, 2010  (JP) ................................. 2010-013235

(51) Int. Cl.
*H03B 5/32* (2006.01)
(52) U.S. Cl.
USPC .......................................... 331/160; 331/109
(58) Field of Classification Search
USPC ................................................. 331/160, 109
See application file for complete search history.

(56) References Cited

U.S. PATENT DOCUMENTS

| | | | | |
|---|---|---|---|---|
| 5,331,296 A | * | 7/1994 | Davis | 331/158 |
| 7,034,628 B1 | * | 4/2006 | Lu et al. | 331/158 |
| 7,895,894 B2 | * | 3/2011 | Kanai et al. | 73/579 |

FOREIGN PATENT DOCUMENTS

| | | |
|---|---|---|
| JP | 62-109406 | 5/1987 |
| JP | 2002-204128 | 7/2002 |
| JP | 2004-242241 | 8/2004 |

* cited by examiner

*Primary Examiner* — Joseph Chang
(74) *Attorney, Agent, or Firm* — McDermott Will & Emery LLP

(57) ABSTRACT

An oscillator circuit comprises a piezoelectric vibrator, an amplifier device including inverters provided in a plurality of stages, and an inverter control device. The inverters provided in the plurality of stages includes a performance-variable inverter configured which is operational in both of an initial phase of oscillation startup and a post-startup phase where the oscillation is stabilized and capable of a variable performance depending on whether the initial phase of oscillation startup or the post-startup phase where the oscillation is stabilized, and an ON/OFF inverter which is operational in the initial phase of oscillation startup and disconnected in the post-startup phase where the oscillation is stabilized. The inverter control device have the performance-variable inverter and the ON/OFF inverter both operational and lowers the performance of the performance-variable inverter in the initial phase of oscillation startup, and the inverter control device disconnects the ON/OFF inverter and increases the performance of the performance-variable inverter in the post-startup phase where the oscillation is stabilized.

15 Claims, 18 Drawing Sheets

F I G. 8
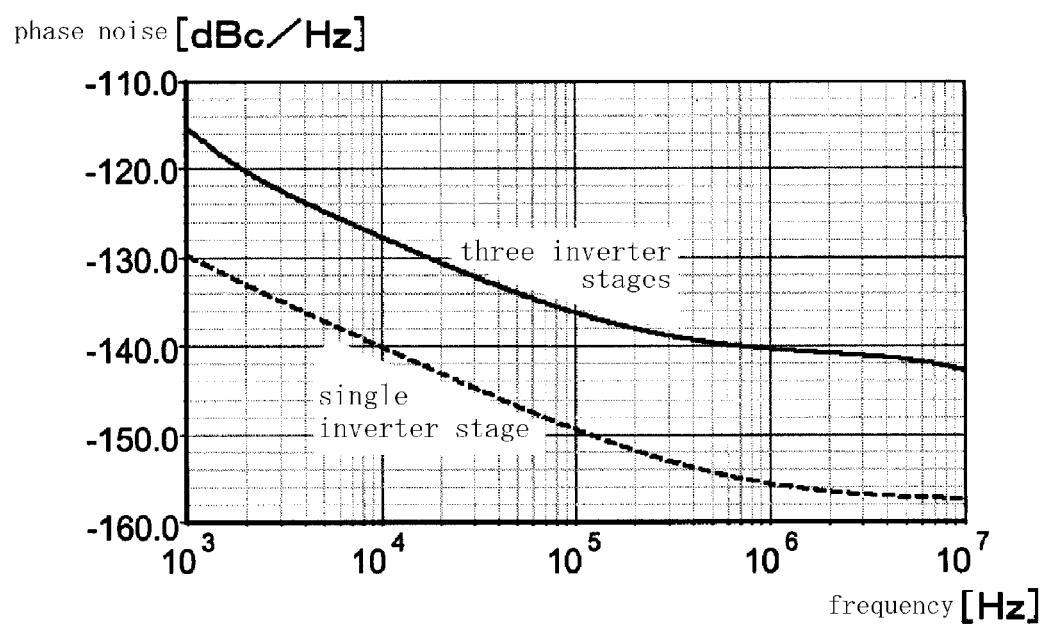

F I G. 1 1
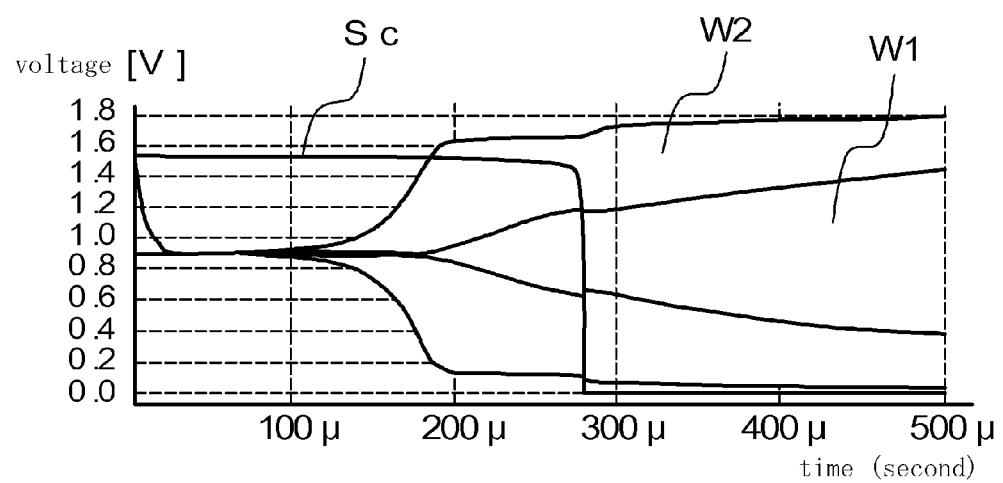

OSCILLATOR CIRCUIT

RELATED APPLICATIONS

This application is the U.S. National Phase under 35 U.S.C. §371 of International Application No. PCT/JP2010/004685, filed on Jul. 22, 2010, which in turn claims the benefit of Japanese Application No. 2010-013235, filed on Jan. 25, 2010, the disclosures of which Applications are incorporated by reference herein.

FIELD OF THE INVENTION

The present invention relates to an oscillator circuit wherein an amplifier device which amplifies an oscillation output of a piezoelectric vibrator includes a plurality of inverter stages, and the number of operational inverter stages is increased in an initial phase of oscillation startup but decreased in a post-startup phase where the oscillation is stabilized, more particularly to a technology for reducing current consumption and preventing any abnormal oscillation resulting from over-performance while improving startup characteristics (quick startup of the oscillation) in the initial phase of oscillation startup, the technology further pursuing noise reduction and ensuring an operation stability in the post-startup phase where the oscillation is stabilized. The present invention is preferably applied to, for example, mobile telephone, automated meter reader, security and disaster control devices. The present invention is particularly serviceable for a longer battery life in any battery-driven devices.

BACKGROUND OF THE INVENTION

In recent years, a greater emphasis is placed on startup characteristics of an intermittent oscillator circuit to improve a battery life. In an IC-chip circuitry system, a constant of equivalent series impedance is becoming smaller as a piezoelectric vibrator is increasingly miniaturized, often deteriorating oscillation startup characteristics. These disadvantages are more noticeable particularly in the technical fields relevant to smart meter-based remote monitoring, automated meter readers, and security systems such as radio-equipped security and disaster control devices.

FIG. 19 illustrates a conventional oscillator circuit equipped with a piezoelectric vibrator. In the drawing, 10 is a piezoelectric vibrator, C1 is a first load capacitance, C2 is a second load capacitance, $I_{nv}$ is an inverter for amplification, and $R_F$ is a feedback resistor for setting a suitable direct current bias point on the input side of the inverter $I_{nv}$. In the oscillator circuit, an amplifier device which amplifies an oscillation output of the piezoelectric vibrator 1 has an inverter in a single stage. FIG. 20 is an illustration of gain-frequency characteristics.

To ensure good startup characteristics demanded in an intermittent operation, a large driving performance is required. The startup characteristics of the oscillator circuit depend on a negative resistance of the oscillator circuit. The negative resistance increases as the driving performance is larger, improving the startup characteristics (less startup time). However, such a large driving performance leads to an increase of current consumption at the same time, failing to meet the demand for improvement of a battery life.

FIG. 21 illustrates a conventional oscillator circuit in which an improvement is made (see the Patent Document 1). Capacitance elements C1 and C2 are connected to between both ends of a piezoelectric vibrator 10 and ground GND, and a feedback resistor $R_F$, and inverters in three stages ($I_{V0}$, $I_{R1}$, $I_{R2}$) are connected in parallel to between the both ends of the piezoelectric vibrator 10. The inverter $I_{V0}$ is an always-ON inverter in the first stage, the inverter $I_{R1}$ is an ON/OFF inverter in the second stage, and the inverter $I_{R2}$ is an ON/OFF inverter in the third stage. An input terminal of the ON/OFF inverter $I_{R1}$ in the second stage and an output terminal of the ON/OFF inverter $I_{R2}$ in the third stage are connected to each other by a selector switch 21. A timer circuit 100 is provided to time-control the selector switch 21 and connected to a control terminal of the selector switch 21 by way of the inverters $I_{R1}$ and $I_{R2}$ in the two stages. Power terminals of the ON/OFF inverter $I_{R1}$ in the second stage and the ON/OFF inverter $I_{R2}$ in the third stage are connected to a power source by way of a switching transistor $Q_x$. An output of the timer circuit 100 is also outputted to a gate of the switching transistor $Q_x$. OUT is an oscillation output terminal, and 20 is an amplifier device which amplifies an oscillation output of the piezoelectric vibrator 10.

In an initial phase of oscillation startup, the selector switch 21 is OFF, and the switching transistor $Q_x$ is ON, and the ON/OFF inverter $I_{R1}$ in the second stage and the ON/OFF inverter $I_{R2}$ in the third stage are operational, constituting a three-stage inverter unit with the always-ON inverter $I_{V0}$ in the first stage.

When a given period of time passed after the oscillation started, the timer circuit 100 times out and outputs a switchover control signal Sc, in response to which the selector switch 21 is switched to ON by way of the inverters $I_{R1}$ and $I_{R2}$ in the two stages. Further, the switching transistor $Q_x$ is disconnected, and the ON/OFF inverters $I_{R1}$ and $I_{R2}$ in the second and third stages thereby short-circuited are disconnected from a path and become non-operational. As a result, the driving performance depends on the always-ON inverter $I_{V0}$ alone in the post-startup phase where the oscillation is stabilized.

Thus, the oscillator circuit illustrated in FIG. 21 starts the operation using the inverters in multiple stages having good startup characteristics, assuring a high negative resistance in the initial phase of oscillation startup, and then switches to the single-inverter operation in the post-startup phase where the oscillation is stabilized to obtain the oscillation with less noise.

The gain of the single-inverter oscillator circuit of FIG. 19 is very low as illustrated in FIG. 20, whereas the oscillator circuit of FIG. 21 driven by the inverters in three stages has a very large gain (see a characteristic curve illustrated on the upper side of FIG. 7).

There is an increasing demand in recent years for an intermittent operation of TCXO (Temperature-Compensated Crystal Oscillator) to improve a battery life of mobile telephones, and startup characteristics are becoming a very important factor to meet the demand. The intermittent operation can save electricity, and high startup characteristics can start the operation sooner to avoid any disadvantages associated with the intermittent operation. When an oscillator circuit used in a mobile telephone is designed to the specifications of an intermittent operation, for example, quick startup makes it unnecessary to take any waiting time, enabling a quick system startup and a longer battery life.

PRIOR ART DOCUMENT

Patent Document 1: Unexamined Japanese Patent Applications Laid-Open No. 2004-242241

Patent Document 1: Unexamined Japanese Patent Applications Laid-Open No. 62-109406

SUMMARY OF THE INVENTION

Problem to be Solved by the Invention

The Patent Document 1, however, fails to give any particular description to a magnitude relation among the driving performances of three inverters ($I_{V0}$, $I_{R1}$, $I_{R2}$). It appears that three inverters have an equal driving performance, in which case there is the following problem particularly noticeable in vehicle-mounted devices and safety-related devices involving human lives.

During the single inverter stage operation in the post-startup phase where the oscillation is stabilized, it is necessary that the inverter be capable of a driving performance large enough to ensure the stability of the oscillation. Conventionally, a measure of evaluating the driving performance is to meet the following requirements. To obtain an expected inverter driving performance in vehicle-mounted devices and safety-related devices involving human lives, a negative resistance of an oscillator circuit should be at least ten times larger than a negative resistance defined by the technical standard of a piezoelectric vibrator. To obtain an expected inverter driving performance in any other devices, a negative resistance of an oscillator circuit should be at least five times larger than a negative resistance defined by the technical standard of a piezoelectric vibrator.

The oscillator circuit disclosed in the Patent Document 1, wherein an equal driving performance is probably exerted by three inverters, has the following disadvantages. Allowing the inverter $I_{V0}$ used in the single inverter stage operation to exert such a driving performance that guarantees the stability in the post-startup phase, there will be an overly high driving performance in the three-inverter operation, possibly causing an abnormal oscillation and failing to effectively trigger the oscillation startup. Another disadvantage is an inevitable increase of current consumption.

The present invention was accomplished to solve the conventional technical problems described so far. The present invention aims at reducing current consumption and preventing any abnormal oscillation resulting from over-performance while improving startup characteristics in an initial phase of oscillation startup (quick startup of the oscillation), and also pursuing noise reduction and ensuring an operation stability in a post-startup phase where the oscillation is stabilized in an oscillator circuit wherein an amplifier device which amplifies an oscillation output of a piezoelectric vibrator includes a plurality of inverter stages, and the number of operational inverter stages is increased in the initial phase of oscillation startup but decreased in the post-startup phase where the oscillation is stabilized.

Means for Solving the Problem

The present invention employs the following measures to solve the conventional technical problems.

1] A description is given below referring to FIG. 1. In an amplifier device 20 connected in parallel to a piezoelectric vibrator 10, inverters provided in a plurality of (odd-numbered) stages are connected in series. How many inverter stages are operational in an oscillator circuit is set differently in an initial phase of oscillation startup and a post-startup phase where the oscillation is stabilized. An inverter control device 30 is provided to increase or decrease the operational inverter stages. In the initial phase of oscillation startup, the number of operational inverter stages is increased as illustrated in A, with a higher priority to startup characteristics (quick startup of oscillation). After the oscillation is stabilized, the number of operational inverter stages is decreased as illustrated in B, with a higher priority to noise reduction. The basic technical concept described so far which underlies the present invention is similar to the prior art.

The present invention is technically characterized in that the inverters provided in multiple stages constituting the amplifier device 20 includes inverters which are differently configured. One of the inverters is operational in the oscillator circuit in both of the initial phase of oscillation startup and the post-startup phase where the oscillation is stabilized, but the performance of the inverter is changed depending on whether the initial phase of oscillation startup or the post-startup phase where the oscillation is stabilized. This inverter is called a performance-variable inverter $I_V$. The performance of the performance-variable inverter $I_V$ is relatively low in the initial phase of oscillation startup (see a blacked-out section) but is relatively high in the post-startup phase where the oscillation is stabilized. The other inverter is operational in the initial phase of oscillation startup (see A) but is non-operational in the post-startup phase where the oscillation is stabilized for noise reduction (see B). The inverter is called an ON/OFF inverter $I_R$. (Because the inverters are provided in an odd number of stages in total, the drawing illustrates two inverters $I_{R1}$ and $I_{R2}$). In the initial phase of oscillation startup, the ON/OFF inverter $I_R$ and the performance-variable inverter $I_V$ are connected in series in the amplifier device 20. It is arbitrarily decided how many ON/OFF inverter $I_R$ and performance-variable inverter $I_V$ are provided, and what sequence of connection is given when the ON/OFF inverter $I_R$ and the performance-variable inverter $I_V$ connected. The ON/OFF inverter $I_R$ may be connected to the input side of the amplifier device 20 with the performance-variable inverter $I_V$ connected to the outside, the performance-variable inverter $I_V$ may be connected to the input side of the amplifier device 20 with the ON/OFF inverter $I_R$ connected to the outside (see FIG. 3), or the performance-variable inverter $I_V$ may be interposed between two ON/OFF inverters $I_R$. The inverter control device 30 is configured to control the inverters of the amplifier device 20 so that more operational inverter stages are operational in the initial phase of oscillation startup as illustrated in A and less operational inverter stages are operational in the post-startup phase where the oscillation is stabilized as illustrated in B.

The technical concept of the present invention is described below. The number of operational inverter stages is increased in the initial phase of oscillation startup to accelerate the oscillation startup, whereas the number of operational inverter stages is decreased in the post-startup phase where the oscillation is stabilized for noise reduction. There is a concern for the operation stability after the oscillation is stabilized because of less operational inverter stages, therefore, it is desirable to use the inverter, a performance of which is high enough to stabilize the operation. When the inverter capable of such a relatively high performance, which is originally intended for the post-startup phase, is directly used with other inverters in the initial phase of oscillation startup, an overall performance consequently achieved by all of the inverters is overly high, possibly causing an abnormal oscillation. To avoid such a risk, the inverter intended for the post-startup phase where the oscillation is stabilized is configured to exercise a variable performance. The inverter thus configured is the performance-variable inverter $I_V$.

In the initial phase of oscillation startup, the inverter control device 30 has the ON/OFF inverter $I_R$ and the performance-variable inverter $I_V$ both operational but controls the performance of the performance-variable inverter $I_V$ so that the overall inverter performance resulting from collaboration of the ON/OFF inverter $I_R$ and the performance-variable inverter $I_V$ in the initial phase of oscillation startup is suitably regulated. The multiple-inverter operation wherein the performance is thus regulated improves the startup characteristics, accelerating the oscillation startup, and also prevents an abnormal oscillation due to over-performance, thereby reducing current consumption.

In the post-startup phase where the oscillation is stabilized, the inverter control device 30 disconnects the ON/OFF inverter $I_R$, while increasing the performance of the performance-variable inverter $I_V$. As a result, noise reduction succeeds because the inverter stages are reduced in the post-startup phase where the oscillation is stabilized, and an inverter performance large enough to ensure the operation stability can be accomplished.

There is not a particular method recommended to distinguish the initial phase of oscillation startup and the post-startup phase from each other (amplitude detection is a preferable example, and time count by a timer is another preferable example, which will be described later).

The specific configuration of the performance-variable inverter $I_V$ in the post-startup phase where the oscillation is stabilized it not necessarily limited as far as any expected function is thereby exerted. A typical example is to connect a plurality of inverters in parallel and switch on and off a part of the inverters. Another example is to configure a single inverter to exert a variable driving performance by controlling power current supplied to the inverter.

Summarizing the description so far, an oscillator circuit according to the present invention comprises:
a piezoelectric vibrator 10;
an amplifier device 20 connected in parallel to the piezoelectric vibrator 10 and configured to amplify an oscillation output from the piezoelectric vibrator 10, the amplifier device 20 including inverters provided in a plurality of stages and connected in series to each other; and
an inverter control device 30 configured to control an operational state of the inverters provided in the plurality of stages constituting the amplifier device 20, wherein
the inverters provided in the plurality of stages constituting the amplifier device 20 includes:
a performance-variable inverter $I_V$ which is operational in both of an initial phase of oscillation startup and a post-startup phase where the oscillation is stabilized and capable of a variable performance depending on whether the initial phase of oscillation startup or the post-startup phase where the oscillation is stabilized; and
an ON/OFF inverter $I_R$ which is operational in the initial phase of oscillation startup and disconnected in the post-startup phase where the oscillation is stabilized, and
the inverter control device 30 have the performance-variable inverter $I_V$ and the ON/OFF inverter $I_R$ both operational and lowers the performance of the performance-variable inverter $I_V$ in the initial phase of oscillation startup, and the inverter control device 30 disconnects the ON/OFF inverter $I_R$ and increases the performance of the performance-variable inverter $I_V$ in the post-startup phase where the oscillation is stabilized.

The oscillator circuit according to the present invention thus technically characterized can accomplish in the initial phase of oscillation startup, 1) quick oscillation startup because of improved start characteristics, no risk of abnormal oscillation, and lower current consumption, and can further accomplish in the post-startup phase where the oscillation is stabilized, 2) noise reduction and an operation stability.

Effect of the Invention

The present invention is technically characterized in that the performance of the performance-variable inverter is regulated in the initial phase of oscillation startup where the ON/OFF inverter and the performance-variable inverter are both operational. The advantages obtained by the technical characteristic are; an overall inverter performance suitably regulated is exerted so that startup characteristics (quick oscillation startup) are improved, while at the same time an abnormal oscillation resulting from over-performance is prevented from happening and current consumption is reduced, and the oscillation is reliably stabilized by increasing the performance of the performance-variable inverter in the post-startup phase where the ON/OFF inverter is disconnected for noise reduction.

BRIEF DESCRIPTION OF THE DRAWINGS

FIG. 8 is a phase noise—frequency characteristic chart of the oscillator circuit according to the exemplary embodiment 1.

FIG. 11 is a waveform chart illustrating an oscillation startup in the oscillator circuit according to the exemplary embodiment 3.

EXEMPLARY EMBODIMENTS FOR CARRYING OUT THE INVENTION

The oscillator circuit according to the present invention described in 1] can be more technically advantageous in exemplary embodiments of the present invention described below.

Figure 21:
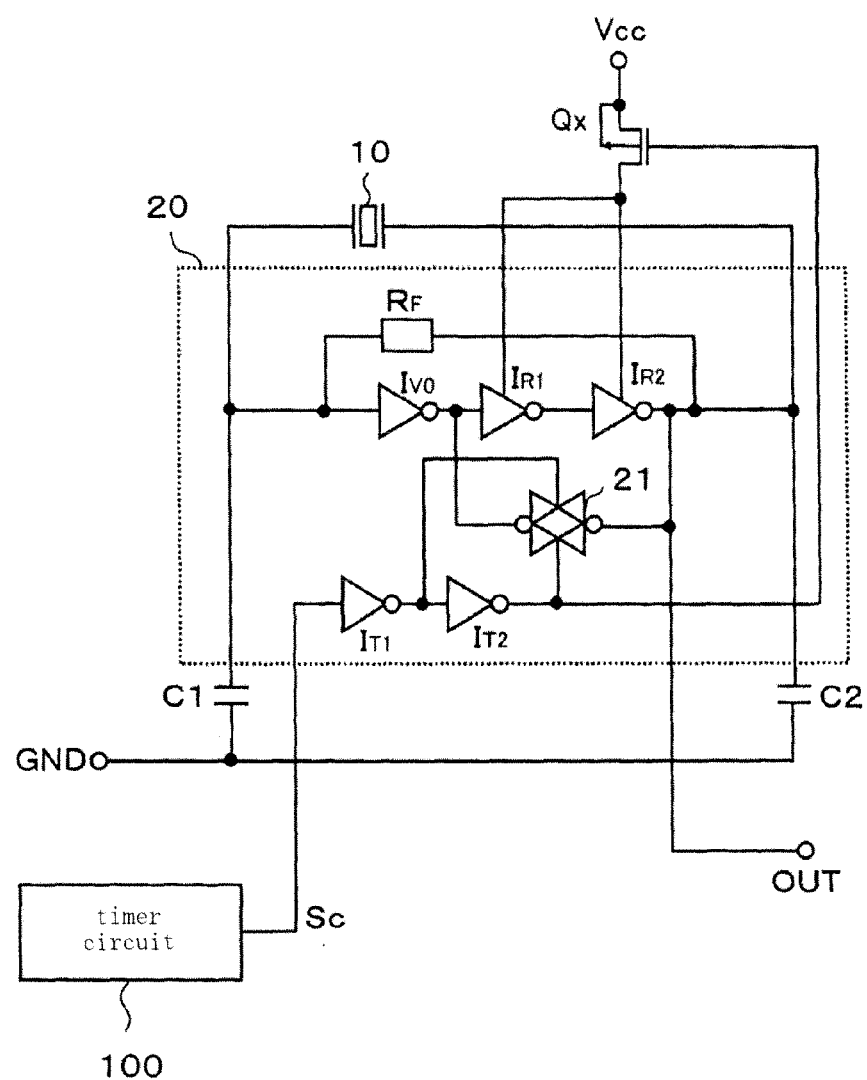
FIG. 21 is a circuit block diagram of a conventional oscillator circuit configured to change the number of operational inverter stages.

2] It is discussed below how the inverter control device 30 sets a timing of switchover to and from two different phases recited in 1], more specifically, how the inverter control device 30 can know a timing of switchover from the initial phase of oscillation startup to the post-startup phase where the oscillation is stabilized. The description in 1] is not limited to any particular timing. In this section 2], it is discussed how the timing can be most suitably set for further improvement. The discussion given in this section can solve the problem generated in the prior art wherein the phase switchover is decided by counting a given period of time using a time circuit (see FIG. 21). In the conventional oscillator circuit wherein the phase change is decided as soon as the given period of time is counted by the timer circuit, an overall operation time of the multiple inverters increases if the preset count time is too long, increasing current consumption. If too a short count time is preset, it may fail to trigger the oscillation startup. An amplitude detection method described in 2] solves this problem as well.

Figure 1:
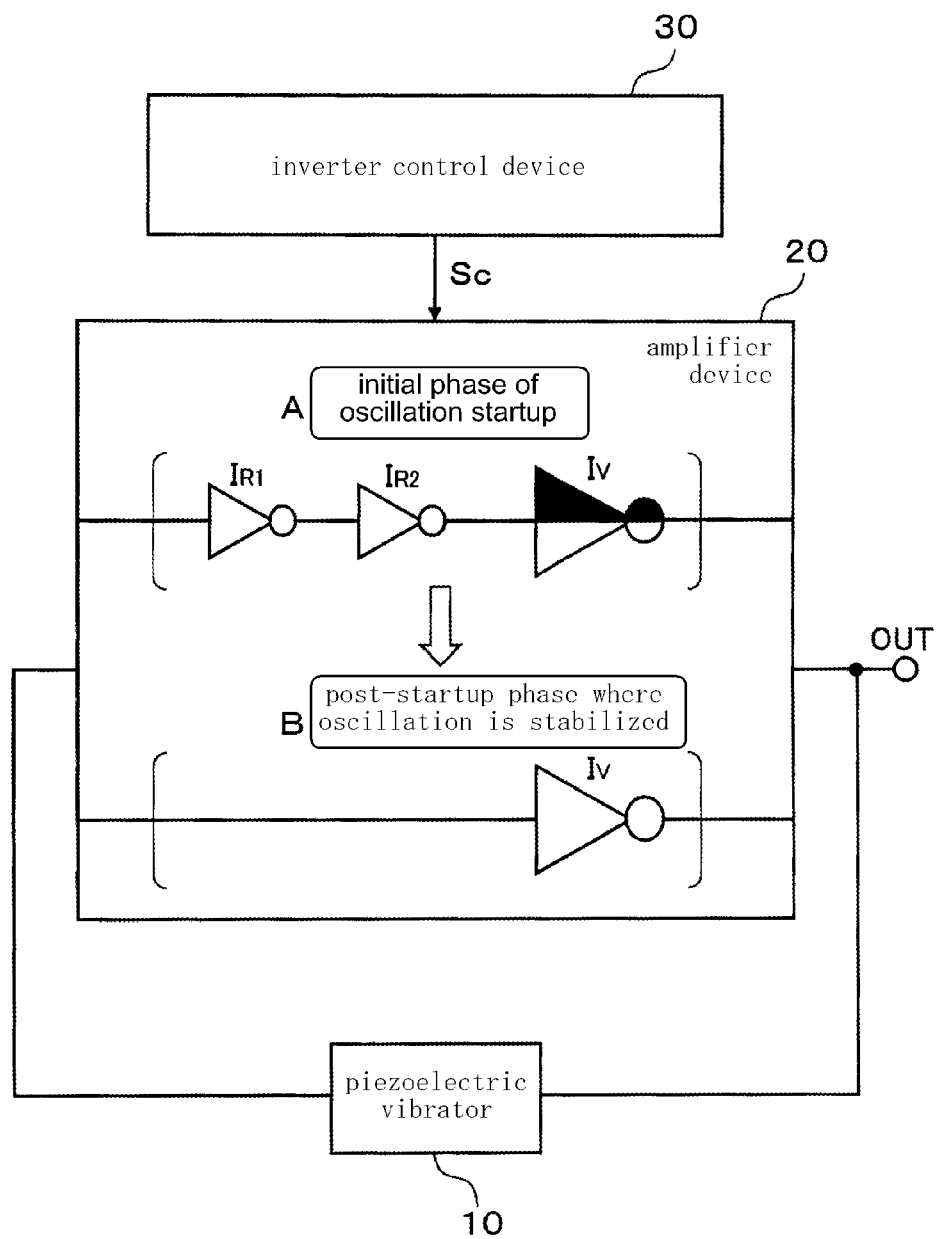
FIG. 1 conceptually illustrates a basic structure of an oscillator circuit according to the present invention.
Figure 2:
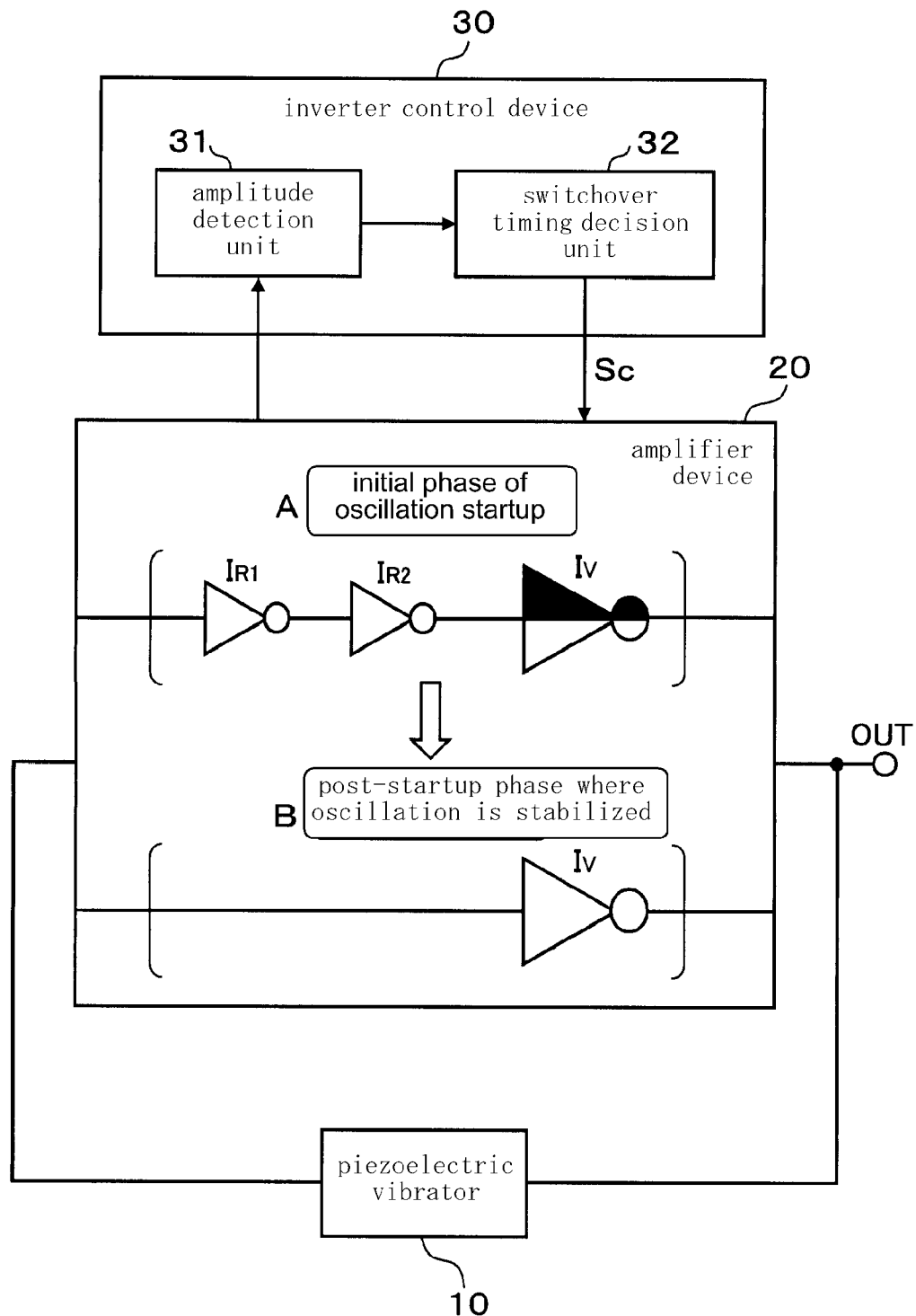
FIG. 2 conceptually illustrates a basic structure of an oscillator circuit according to exemplary embodiments of the present invention.

A description is given below referring to FIG. 2. When the oscillator circuit is activated, an oscillation output increases with time, more specifically, the amplitude of a signal (voltage, current) in the amplifier device 20 increases with time. The signal amplitude is detected, and connection or disconnection of the inverters is selected when the detected amplitude equals to a given threshold value. To detect and evaluate the signal amplitude in the amplifier device 20 which increases with time after the oscillation startup, an amplitude detection unit 31 and a switchover timing decision unit 32 are provided in the inverter control device 30.

The amplitude detection unit 31 is configured to detect a peak value of the signal in the amplifier device 20. A section of the amplifier device 20 where the signal is detected by the amplitude detection unit 31 can be arbitrarily decided. The signal may be obtained in an input terminal or an output terminal of the amplifier device 20, or any other section of the amplifier device 20 arbitrarily chosen.

The switchover timing decision unit 32 generates a switchover control signal Sc when the signal amplitude in the amplifier device 20 detected by the amplitude detection unit 31 equals to the given threshold value, and switches the operation in the initial phase of oscillation startup to the operation in the post-startup phase. More specifically, the switchover control signal Sc is outputted to the amplifier device 20 to reduce the number of operational inverter stages and change the driving performance of the performance-variable inverter. The given threshold value used by the switchover timing decision unit 32 is such a value of amplitude that can guarantee that the oscillation of the oscillator circuit is substantially stabilized.

Summarizing the technical characteristic of 1], the inverter control device 30 comprises the amplitude detection unit 31 configured to detect the amplitude of a signal from any arbitrary section of the amplifier device 20, and the switchover timing decision unit 32 configured to generate and output the switchover control signal Sc which is a trigger of the operational state switchover of the inverters when the amplitude detected by the amplitude detection unit 31 equals to the given threshold value.

The oscillator circuit thus technically characterized can know in detail the condition of the oscillation startup in the initial phase of oscillation startup by monitoring the signal of the amplifier device 20, and the generates and outputs the switchover control signal Sc by a timing most suitable for the condition of the oscillation startup at the time, thereby optimizing the timing of the operational state switchover of the inverters. The oscillator circuit thus technically advantageous can trigger the oscillation startup well, and prevent the current consumption from increasing by not prolonging the multiple-inverter operation.

Figure 3A:
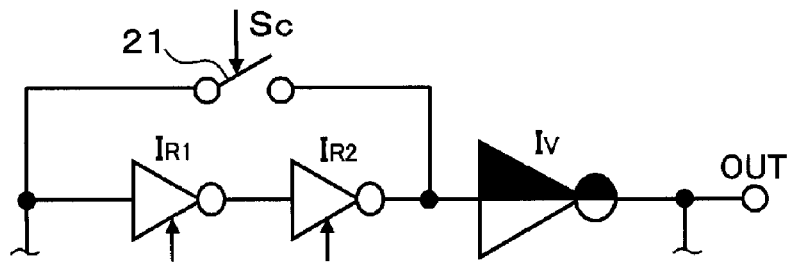
FIG. 3A illustrates a first connection manner of inverters provided in a plurality of stages according to the exemplary embodiments of the present invention.
Figure 3B:
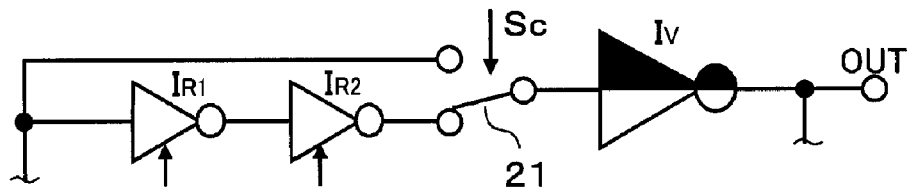
FIG. 3B illustrates a second connection manner of inverters provided in a plurality of stages according to the exemplary embodiments of the present invention.
Figure 3C:
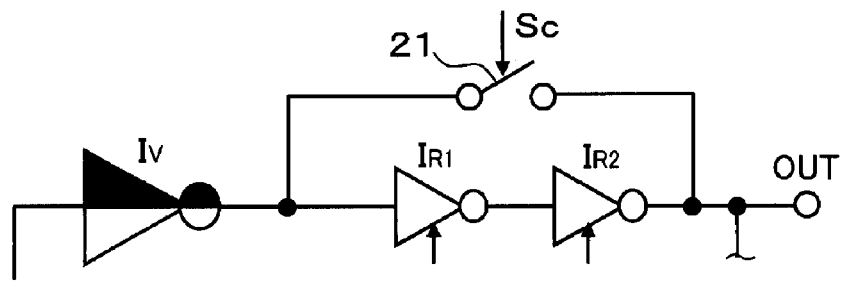
FIG. 3C illustrates a third connection manner of inverters provided in a plurality of stages according to the exemplary embodiments of the present invention.
Figure 3D:
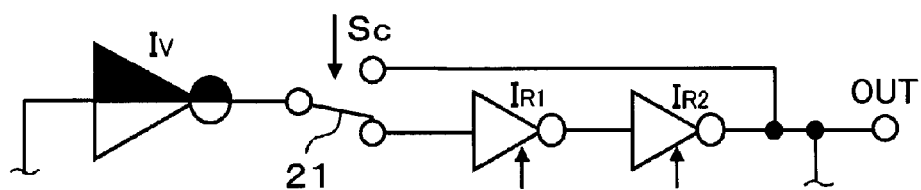
FIG. 3D illustrates a fourth connection manner of inverters provided in a plurality of stages according to the exemplary embodiments of the present invention.

3] In 1] and 2], the ON/OFF inverter $I_R$ and the performance-variable inverter $I_V$ may be connected as illustrated in examples of FIGS. 3A-3D. FIGS. 3A and 3C illustrate a short-circuit connection manner, and FIGS. 3B and 3D illustrate a path switchover connection manner. In the examples illustrated in FIGS. 3A and 3B, the performance-variable inverter $I_V$ is connected to the output side of the amplifier device 20. In the examples illustrated in FIGS. 3C and 3D, the performance-variable inverter $I_V$ is connected to the input side of the amplifier device 20.

The selector switch 21 is provided between input and output terminals of the amplifier device 20 to select the connection or disconnection of the ON/OFF inverter $I_R$. The selector switch 21 is controlled by the switchover control signal Sc outputted from the inverter control device 30. In a first state of the selector switch 21 in the initial phase of oscillation startup, the ON/OFF inverter $I_R$ and the performance-variable inverter $I_V$ are connected to between the input and output terminals of the amplifier device 20, and the ON/OFF inverter $I_R$ and the performance-variable inverter $I_V$ are connected in series to each other. In a second state of the selector switch 21 in the post-startup phase where the oscillation is stabilized, the ON/OFF inverter $I_R$ is disconnected from between the input and output terminals of the amplifier device 20, and the performance-variable inverter $I_V$ alone remains connected.

The inverter control device 30 thus controls the ON/OFF inverter $I_R$ and the performance-variable inverter $I_V$.

4] In 1]-3], the ON/OFF inverter $I_R$ disconnected from the amplifier device 20 is non-operational. Therefore, the operation of the ON/OFF inverter $I_R$ is preferably suspended based on the switchover control signal Sc outputted from the inverter control device 30. In FIGS. 3A-3D, an arrow illustrated below the ON/OFF inverter $I_R$ denotes the suspension of the inverter operation. Thus configured, overconsumption of power can be prevented.

A specific examples of 1]-4] is described in an exemplary embodiment 1 of the present invention.

Exemplary Embodiment 1

Figure 4:
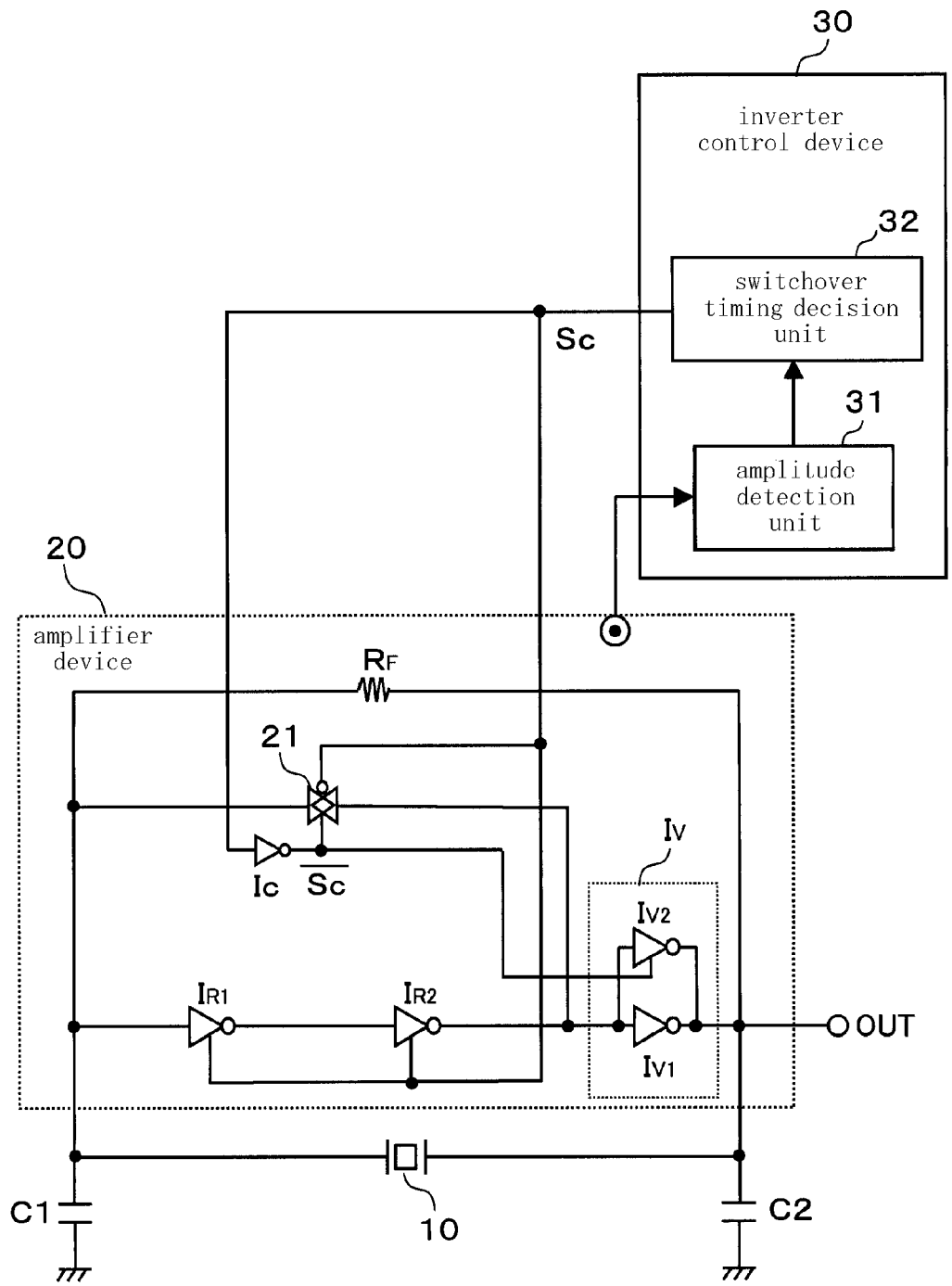
FIG. 4 is a circuit block diagram illustrating a structural characteristic of an oscillator circuit according to an exemplary embodiment 1 of the present invention.
Figure 5A:
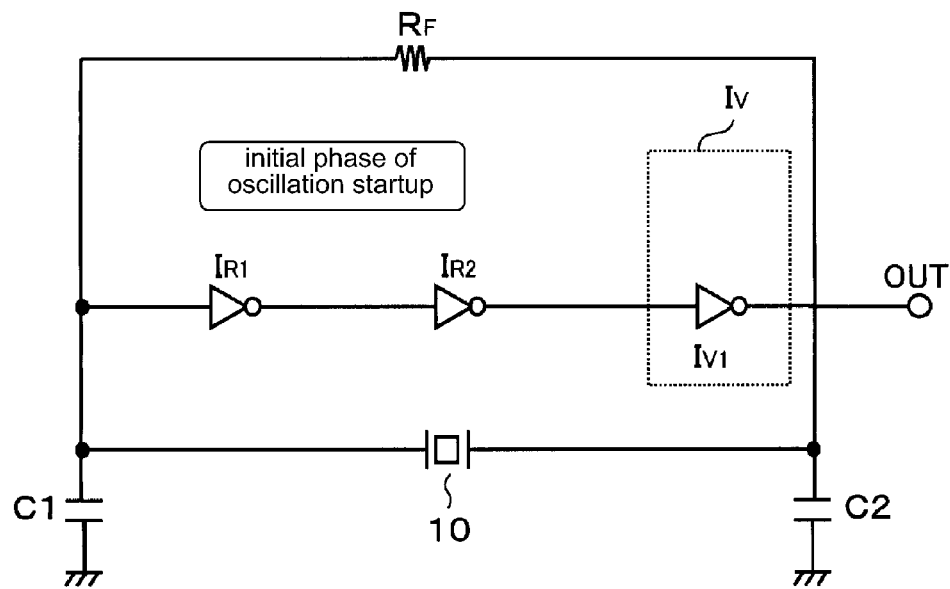
FIG. 5A illustrates a circuit configuration of main structural elements in an initial phase of oscillation startup in the oscillator circuit according to the exemplary embodiment 1.
Figure 5B:
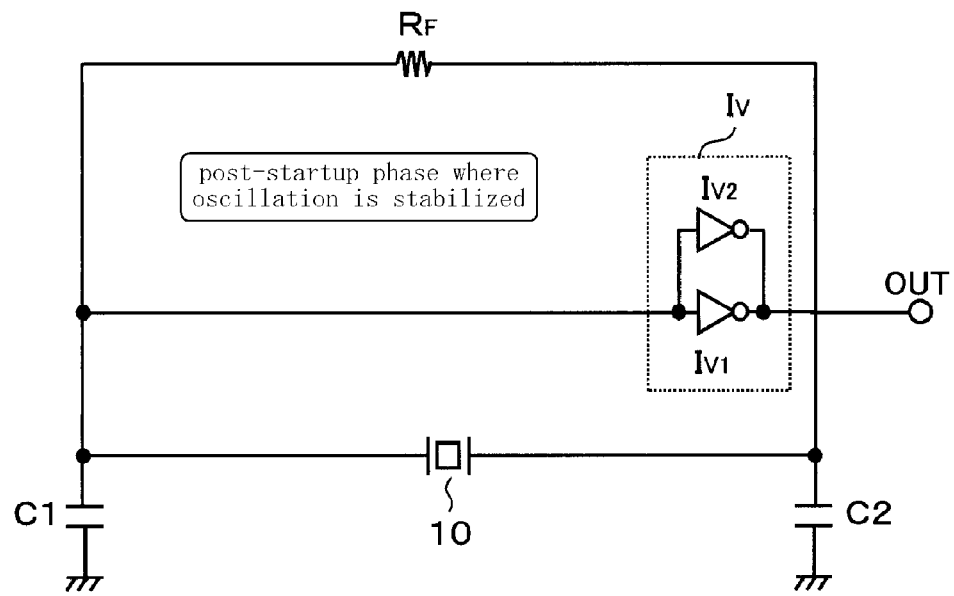
FIG. 5B illustrates a circuit configuration of main structural elements in a post-startup phase where the oscillation is stabilized in the oscillator circuit according to the exemplary embodiment 1.

FIG. 4 is a circuit block diagram illustrating a structural characteristic of an oscillator circuit according to an exemplary embodiment 1 of the present invention. FIG. 5A illustrates a circuit configuration of main structural elements of the oscillator circuit in an initial phase of oscillation startup. FIG. 5B illustrates a circuit configuration of the main structural elements in a post-startup phase where the oscillation is stabilized. Referring to the drawings, 10 is a piezoelectric vibrator such as a quartz resonator, 20 is an amplifier device including inverters provided in a plurality of stages ($I_{R1}$, $I_{R2}$, $I_V$) and configured to amplify an oscillation output of the piezoelectric vibrator 10, and 30 is an inverter control device which controls the inverters of the amplifier device 20. In the present exemplary embodiment, the inverter control device 30 includes an amplitude detection unit 31 and a switchover timing decision unit 32.

A first load capacitance C1 and a second load capacitance C2 are connected to between both ends of the piezoelectric vibrator 10 and terminals having a particular potential (for example, ground GND). The amplifier device 20 includes an ON/OFF inverter $I_{R1}$ in a first stage, an ON/OFF inverter $I_{R2}$ in a second stage, a performance-variable inverter $I_V$ in a third stage, a feedback resistor $R_F$, a selector switch 21, and a switchover control inverter Ic. The feedback resistor $R_F$ is connected to between the both ends of the piezoelectric vibrator 10. The ON/OFF inverter $I_{R1}$ in the first stage, ON/OFF inverter $I_{R2}$ in the second stage, and performance-variable inverter $I_V$ in the third stage are connected in series to one another. An input terminal of the ON/OFF inverter $I_{R1}$ in the first stage is connected to one of the ends of the piezoelectric vibrator 10, and an output terminal of the performance-variable inverter $I_V$ in the third stage is connected to the other end of the piezoelectric vibrator 10. The performance-variable inverter $I_V$ in the third stage includes a first inverter $I_{V1}$ and a second inverter $I_{V2}$ connected in parallel to each other. A connection point of the ON/OFF inverter $I_{R2}$ in the second stage and the performance-variable inverter $I_V$ in the third stage is connected to one of the ends of the piezoelectric vibrator 10 by two paths. A series circuit configured of the ON/OFF inverter $I_{R1}$ in the first stage and the ON/OFF inverter $I_{R2}$ in the second stage is formed in one of the paths, and the selector switch 21 is inserted in the other path. The selector switch 21 is configured of a transmission gate. The selector switch 21 is switched on and off by the switchover control signal Sc outputted from the inverter control device 30 and an inversion signal /Sc thereof outputted from the switchover control inverter Ic. When the selector switch 21 is OFF, the ON/OFF inverter $I_{R1}$ in the first stage, ON/OFF inverter $I_{R2}$ in the second stage, and performance-variable inverter $I_V$ in the third stage are all operational as a three-stage inverter unit of the amplifier device 20. When the selector switch 21 is ON, the ON/OFF inverter $I_{R1}$ in the first stage and the ON/OFF inverter $I_{R2}$ in the second stage are short-circuited and disconnected, and the performance-variable inverter $I_V$ in the third stage alone is an operational inverter as a single-stage inverter unit of the amplifier device 20.

The ON/OFF inverter $I_{R1}$ in the first stage and the ON/OFF inverter $I_{R2}$ in the second stage respectively configured of a tristate inverter. The switchover control signal Sc outputted from the inverter control device 30 is inputted to control terminals of the ON/OFF inverters $I_{R1}$ and $I_{R2}$ in the first and second stages. When the switchover control signal S is at "H" level, the ON/OFF inverters $I_{R1}$ and $I_{R2}$ in the first and second stages normally operate. When the switchover control signal S is at "L" level, the ON/OFF inverters $I_{R1}$ and $I_{R2}$ in the first and second stages is in high impedance (electrically insulated). As a result, the ON/OFF inverters $I_{R1}$ and $I_{R2}$ are non-operational.

The second inverter $I_{V2}$ of the performance-variable inverter $I_V$ in the third stage is also configured of a tristate inverter. The second inverter $I_{V2}$ is switched on and off by the switchover control signal Sc outputted from the inverter control device 30 and the inversion signal /Sc thereof from the switchover control inverter Ic. When the switchover control signal S is at "H" level, the second inverter $I_{V2}$, to which "L" level inverted by the switchover control inverter Ic is applied, becomes non-operational. When the switchover control signal S is at "L" level, on the other hand, the second inverter $I_{V2}$ is operational.

The inverter control device 30 is configured as described below. In an initial phase where the signal amplitude in the amplifier device 20 is zero or still very weak, the switchover control signal Sc from the switchover timing decision unit 32 is at "H" level. In response to the oscillation startup, the signal amplitude in the amplifier device 20 is elevated. When the signal amplitude finally equals to a given threshold value, the oscillation is stabilized, and the switchover control signal Sc turns to "L" level. The given threshold value used by the switchover timing decision unit 32 is such a value of amplitude that can guarantee that the oscillation of the oscillator circuit is substantially stabilized. The switchover control signal Sc at "H" level in the initial phase of oscillation startup switches off the selector switch 21 so that the second inverter $I_{V2}$ of the performance-variable inverter $I_V$ in the third stage is non-operational. The switchover control signal Sc at "L" level in the post-startup phase where the oscillation is stabilized switches on the selector switch 21 to reduce the operational inverter stages so that the second inverter $I_{V2}$ of the performance-variable inverter $I_V$ in the third stage is operational.

The operation of the oscillator circuit according to the present exemplary embodiment thus technically characterized is described below. When, for example, an inactive oscillator circuit is turned on, the inverter control device 30 outputs the switchover control signal Sc at "H" level as an operation step in the initial phase of oscillation startup. The switchover control signal Sc at "H" level makes the ON/OFF inverters $I_{R1}$ and $I_{R2}$ in the first and second stages operational. The "L" level signal inverted by the switchover control inverter Ic makes the second inverter $I_{V2}$ of the performance-variable inverter $I_V$ in the third stage non-operational. At the same time, the selector switch 21 configured of the transmission gate is switched off, and the inverters $I_{R1}$ and $I_{R2}$ in the first and second stages are thereby connected. Therefore, the amplifier device 20 performs the three-inverter operation using the ON/OFF inverters $I_{R1}$ and $I_{R2}$ and the first inverter $I_{V1}$ in the third stage (second inverter $I_{V2}$ in the third stage is non-operational), which is illustrated in FIG. 5A. Then, the oscillation starts. In the initial phase of oscillation startup, the oscillation can start very quickly because of the three-inverter operation, however, an abnormal oscillation due to over-performance can be prevented from happening because the second inverter $I_{V2}$ in the third stage is non-operational.

In the post-startup phase where the oscillation is stabilized, the inverter control device 30 shifts the switchover control signal Sc from "H" level to "L" level. Then, the selector switch 21 is switched on, and the resulting short circuit makes the ON/OFF inverters $I_{R1}$ and $I_{R2}$ in the first and second stages disconnected and non-operational. The second inverter $I_{V2}$ in the third stage currently non-operational then becomes operational. Therefore, the amplifier device 20 shifts to the single-inverter operation using the performance-variable inverter $I_V$ alone in which the first inverter $I_{V1}$ and the second inverter $I_{V2}$ are connected in parallel, which is illustrated in FIG. 5B.

If the first inverter $I_{V1}$ in the third stage alone is operated in the post-startup phase where the oscillation is stabilized, the driving performance of the performance-variable inverter $I_V$ in the third stage is not powerful enough to stabilize the oscillation (as described earlier, a negative resistance of an oscillator circuit should be at least five-ten times larger than a negative resistance in the technical standard of a piezoelectric vibrator). To overcome the technical disadvantage, the second inverter $V_2$ in the third stage is switched on so that the first inverter $V_1$ and the second inverter $V_2$ are both operated at the same time to increase the driving performance.

The technical characteristic can be evaluated as described below from a different angle. If a single inverter with a constant performance is provided in place of the two inverters connected in parallel in the third stage, and the constant-performance inverter is given such a large driving performance that guarantees the stability in the post-startup phase, an overall driving performance in the three-stage operation in the initial phase of oscillation startup is overly high, causing an abnormal oscillation and unnecessarily increasing current consumption. To avoid such a disadvantage, the performance-variable inverter is used in the third stage, and the performance of the performance-variable inverter, though maximized in the post-startup phase, is regulated in the initial phase of oscillation startup so that such an abnormal oscillation and excess current consumption can be prevented from happening.

Figure 19:
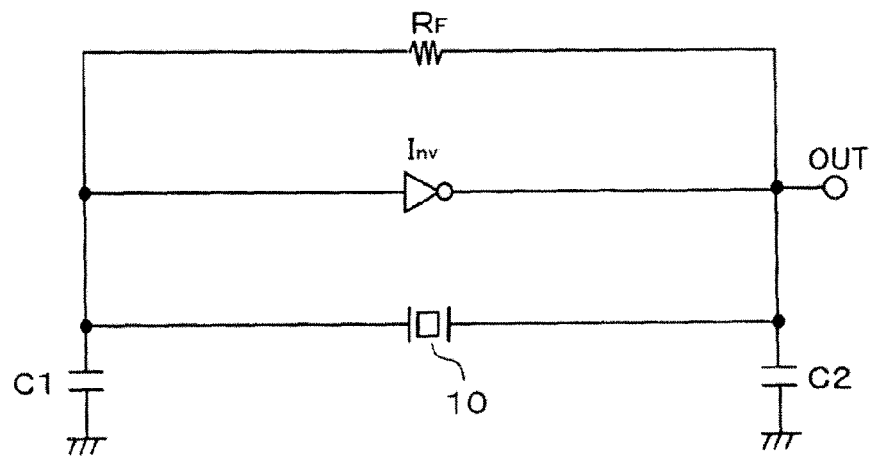
FIG. 19 is a circuit block diagram of a conventional single-inverter oscillator circuit.
Figure 20:
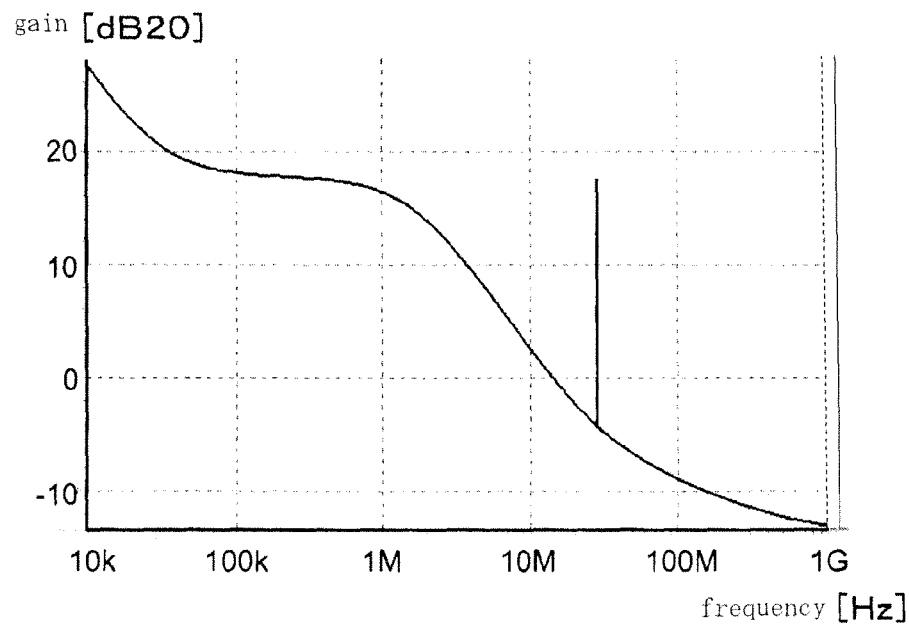
FIG. 20 is a gain-frequency characteristic chart of the conventional single-inverter oscillator circuit.

As described so far, the inverters in three stages are used in the operation of the amplifier device 20 in the initial phase of oscillation startup. As a result, the overall driving performance of the inverters increases, accelerating the oscillation startup with better startup characteristics. According to the present exemplary embodiment, the oscillation startup phase has a length of, for example, approximately 400 µm. Thus, the startup characteristics are largely improved as compared to the conventional single-inverter circuit illustrated in FIG. 19 wherein the oscillation startup phase has a length of a few ms.

Figure 7:
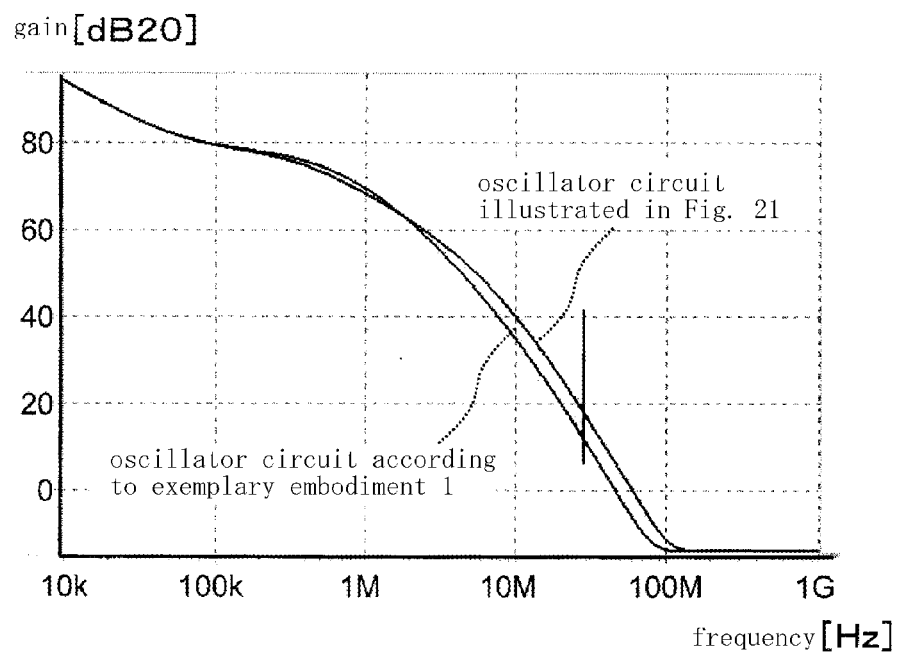
FIG. 7 is a gain-frequency characteristic chart of the oscillator circuit according to the exemplary embodiment 1.

Another advantage is to avoid the risk of abnormal oscillation in the initial phase of oscillation startup by making the second inverter $I_{V2}$ in the third stage non-operational to lower the performance of the performance-variable inverter $I_V$ in the third stage. As illustrated in a characteristic curve on the lower side of FIG. 7, a loop gain of the oscillator circuit is lower than that of the oscillator circuit illustrated in FIG. 21 (characteristic curve on the upper side of FIG. 7). Therefore, the risk of abnormal oscillation is reliably avoided.

Describing an improvement in the current consumption, the current consumption in the three-inverter operation when the performance of the performance-variable inverter $I_V$ is not regulated (FIG. 21) is 1.02 mA, while the current consumption when the performance of the performance-variable inverter $I_V$ is regulated is, for example, 0.75 mA. Thus, a large reduction was confirmed in the current consumption.

There is only a single operational inverter stage in the post-startup phase, which is advantageous in that a high noise reduction effect can be achieved (see FIG. 8). Regardless of the single operational inverter stage, the operation stability is favorably obtained because the first and second high-performance inverters $I_{V1}$ and $I_{V2}$ connected in parallel are used in the operation.

To ensure the operation stability, the driving performance of the performance-variable inverter $I_V$ in the third stage including the first and second inverters $I_{V1}$ and $I_{V2}$ connected in parallel is preferably set so as to meet the following requirement. To obtain an expected inverter driving performance in vehicle-mounted devices and safety-related devices involving human lives, the negative resistance of the oscillator circuit should be, for example, at least ten times larger than the negative resistance in the technical standard of the piezoelectric vibrator. To obtain an expected inverter driving performance in any other devices, the negative resistance of the oscillator circuit should be, for example, at least five times larger than the negative resistance in the technical standard of the piezoelectric vibrator.

The driving performances of the first and second inverters $I_{V1}$ and $I_{V2}$ in the third stage are preferably set so as to meet the before-mentioned requirement. When the driving performances are thus set, the following objectives can be successfully achieved; avoidance of the risk of abnormal oscillation in the initial phase of oscillation startup, and the noise reduction (FIG. 8) and operation stability in the post-startup phase where the oscillation is stabilized.

According to the present exemplary embodiment described so far, the number of operational inverter stags in the amplifier device 20 and the driving performance of the performance-variable inverter $I_V$ in the third stage are changeable depending on whether the initial phase of oscillation startup or the post-startup phase where the oscillation is stabilized, and the inverter control device 30 in charge of controlling these changes is provided. The oscillator circuit thus technically advantageous eliminates the risk of abnormal oscillation with favorable startup characteristics and thereby reduces power consumption in the initial phase of oscillation startup, and achieves the operation stability with less noise in the post-startup phase where the oscillation is stabilized. The inverter control device 30 according to the present exemplary embodiment includes the amplitude detection unit 31 and the switchover timing decision unit 32, however, a timer circuit may constitute the inverter control device 30.

5] It is discussed below in which section of the amplifier device 20 the signal amplitude is detected by the amplitude detection unit 31 recited in 2]. In this section, the amplitude detection unit 31 is configured to detect the amplitude of an output signal of the amplifier device 20, in which case there are advantages described below. A weak amplitude signal of the piezoelectric vibrator 10 is adequately amplified by the multiple inverters of the amplifier device 20, and the signal amplitude thus substantially amplified is detected. Therefore, the signal amplitude is more accurately detected than the weak amplitude originally obtained from the piezoelectric vibrator 10. As a result, the inverter stages and the driving performance can be more changed sooner and more accurately. This technical characteristic is suitable for a mode which places an emphasis on accelerating the switchover timing.

A specific example of 5] is described below in an exemplary embodiment 2 of the present invention.

Exemplary Embodiment 2

Figure 9:
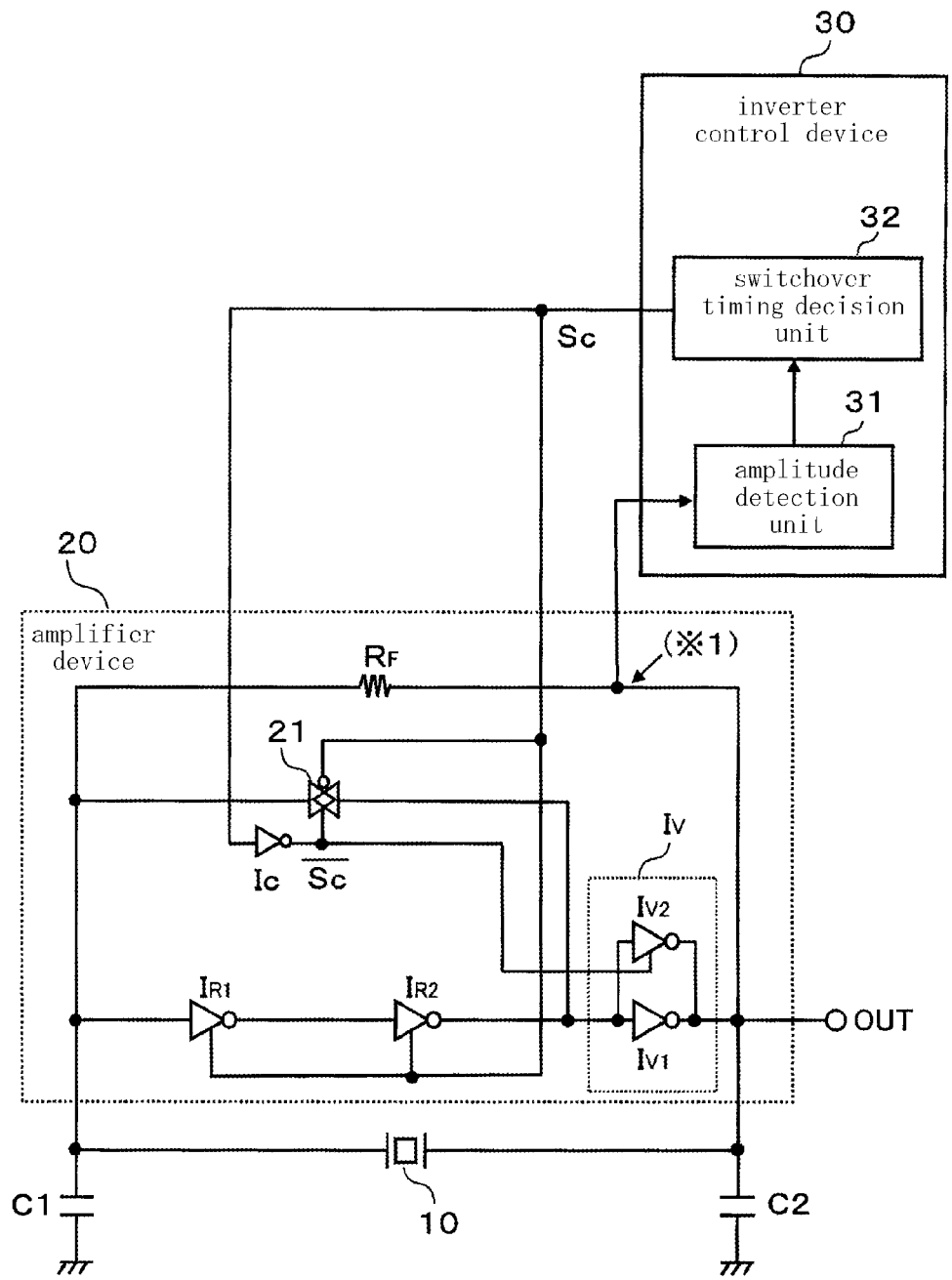
FIG. 9 is a circuit block diagram illustrating a structural characteristic of an oscillator circuit according to an exemplary embodiment 2 of the present invention.

FIG. 9 is a circuit block diagram illustrating a structural characteristic of an oscillator circuit according to an exemplary embodiment 2 of the present invention. The oscillator circuit according to the present exemplary embodiment is a modified embodiment of the oscillator according to the exemplary embodiment 1, focusing on in which section of the amplifier device 20 the signal amplitude is detected by the amplitude detection unit 31 of the inverter control device 30. According to the exemplary embodiment 2, an input terminal of the amplitude detection unit 31 is connected to an output terminal of the amplifier device 20, and the amplitude detection unit 31 is configured to detect the amplitude of an output signal of the amplifier device 20 (see *1). Any other structural elements similar to those of FIG. 4 according to the exemplary embodiment 1 are simply illustrated with the same reference symbols, and description of the similar structural elements is omitted.

Figure 6:
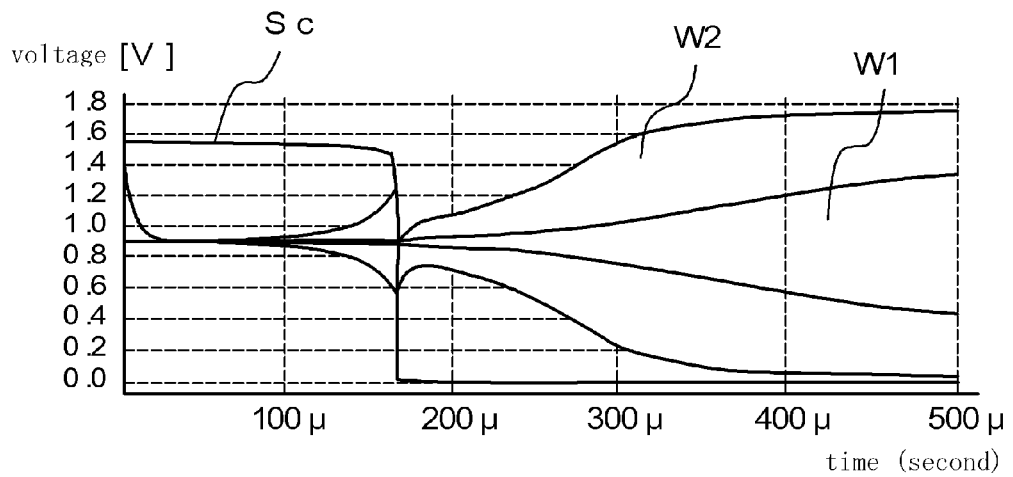
FIG. 6 is a waveform chart illustrating an oscillation startup in the oscillator circuit according to the exemplary embodiment 1.

In the present exemplary embodiment, a weak amplitude signal outputted from the piezoelectric vibrator 10 is amplified with a large gain of the inverters in multiple stages, and the resulting signal is outputted from the amplifier device 20 as an output signal. The amplitude detection unit 31 inputs therein the output signal thus largely amplified of the amplifier device 20 to detect the amplitude of the inputted signal. FIG. 6 illustrates a waveform W1 of the signal inputted to the amplifier device 20 which is the weak output signal of the piezoelectric vibrator 10, and a waveform W2 of the output signal of the amplifier device 20 obtained by substantially amplifying the weak input signal. Compared to the waveform W1 of the weak output signal from the piezoelectric vibrator 10, the waveform W2 of the output signal from the amplifier 20 is very large. Therefore, the switchover timing can be decided sooner to output the switchover control signal Sc. Though such a large gain that can lead to the risk of abnormal oscillation is obtained in the initial phase of oscillation startup because the inverters in three stages are used in the operation of the amplifier device 20, the switchover timing is accelerated so that the duration of instability is minimized. Therefore, the risk of abnormal oscillation can be surely eliminated, and the oscillation can be stabilized. As a minor disadvantage, the amplitude is temporarily weakened after the switchover, and more time may be needed to stabilize the oscillation in the post-startup phase. The increased time, however, shows a large improvement as compared to a few ms in the prior art, causing no particular problems in the startup characteristics.

According to the present exemplary embodiment described so far, the signal of the amplifier device 20 detected by the amplitude detection unit 31 is used as the output signal of the amplifier device 20, so that the duration of instability due to the inverters in multiple stages is shortened without affecting the good startup characteristics, and the oscillation can be better stabilized.

6] In this section the amplitude detection unit 31 recited in 2] is configured to detect the amplitude of the input signal of the amplifier device 20, in which case there are advantages described below. The switchover timing is decided in response to the detection of the output amplitude of the piezoelectric vibrator 10, meaning that the switchover timing is decided after the amplitude is elevated to be large enough by the piezoelectric vibrator 10 substantially excited. In the case of 5] where the switchover timing is accelerated, it takes longer for the oscillation to be stabilized because the amplitude is often weakened after the switchover when the operation depends on the driving performance of the performance-variable inverter $I_V$ alone. However, there is no longer such a disadvantage, and the amplitude is not weakened though the performance-variable inverter $I_V$ alone exercises its driving performance after the switchover, so that the oscillation can be more speedily stabilized (see FIG. 11). This technical characteristic is suitable for a mode which places an emphasis on stabilizing the oscillation.

A specific example of 6] is described below in an exemplary embodiment 3 of the present invention.

Exemplary Embodiment 3

Figure 10:
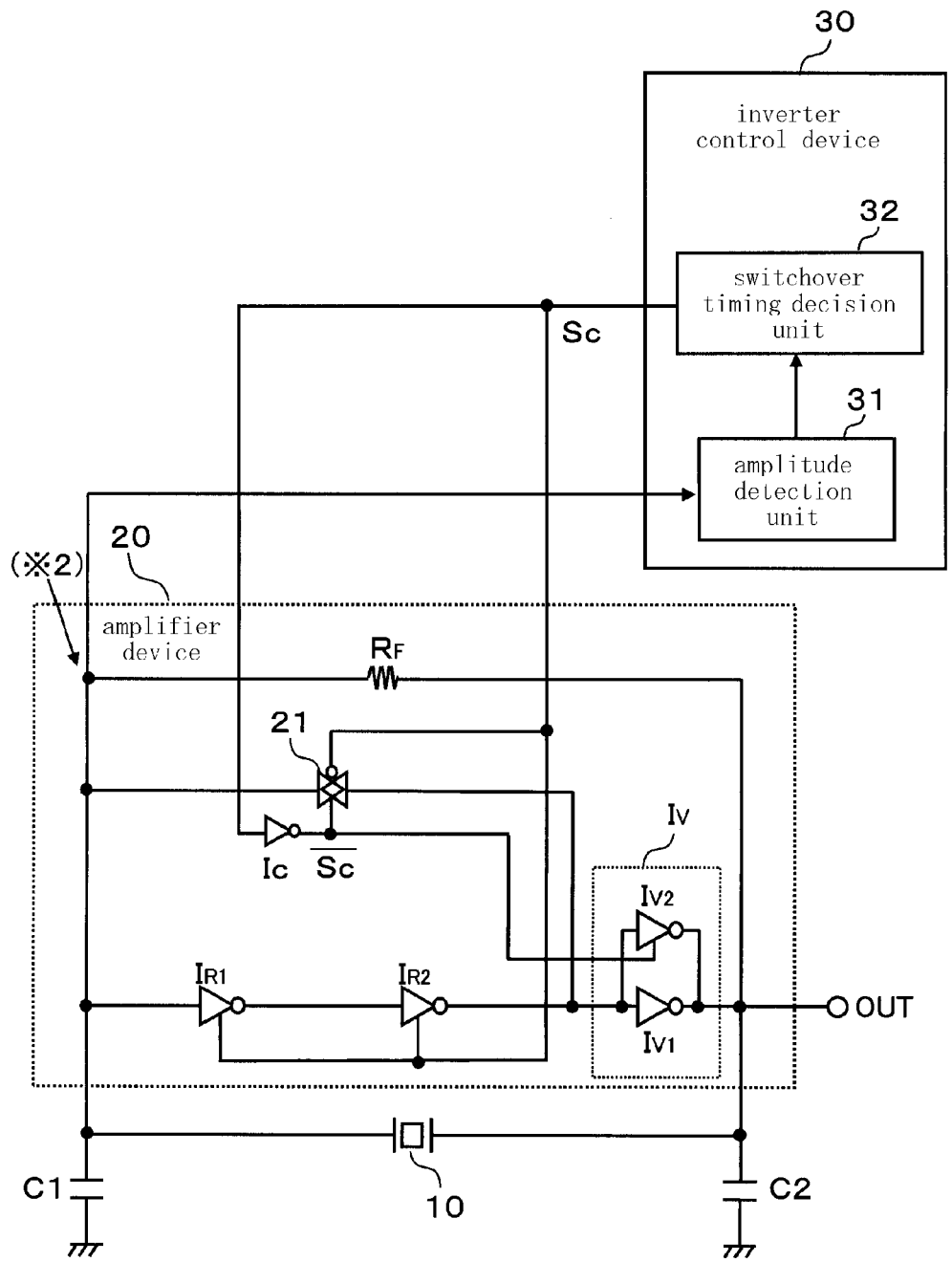
FIG. 10 is a circuit block diagram illustrating a structural characteristic of an oscillator circuit according to an exemplary embodiment 3 of the present invention.

FIG. 10 is a circuit block diagram illustrating a structural characteristic of an oscillator circuit according to an exemplary embodiment 3 of the present invention. The oscillator circuit according to the present exemplary embodiment is another modified embodiment of the oscillator according to the exemplary embodiment 1, focusing on in which section of the amplifier device 20 the signal amplitude is detected by the amplitude detection unit 31 of the inverter control device 30.

According to the exemplary embodiment 3, an input terminal of the amplitude detection unit 31 is connected to an input terminal of the amplifier device 20, and the amplitude detection unit 31 is configured to detect the amplitude of an input signal of the amplifier device 20 (see *2). Any other structural elements similar to those of FIG. 4 according to the exemplary embodiment 1 are simply illustrated with the same reference symbols, and description of the similar structural elements is omitted.

In the present exemplary embodiment, the input signal of the amplifier device 20 is the output signal of the piezoelectric vibrator 10. When the amplitude of the output signal of the piezoelectric vibrator 10 detected by the amplitude detection unit 31 reaches a given threshold value, the switchover timing decision unit 32 outputs the switchover control signal Sc. As illustrated in FIG. 11, the switchover timing is decided after the amplitude of the output signal of the piezoelectric vibrator 10 is substantially increased. When the switchover control signal Sc is outputted, the output signal of the piezoelectric vibrator 10 is already substantially large and is not weakened again as illustrated in FIG. 6 after the operation shifts to the single-stage operation using the performance-variable inverter $I_V$ in the third stage. As a result, the oscillation can be stabilized in a shorter period of time.

According to the present exemplary embodiment, the input signal of the amplifier device 20 is detected by the amplitude detection unit 31 so that the oscillation can be stabilized in a shorter period of time.

Figure 12:
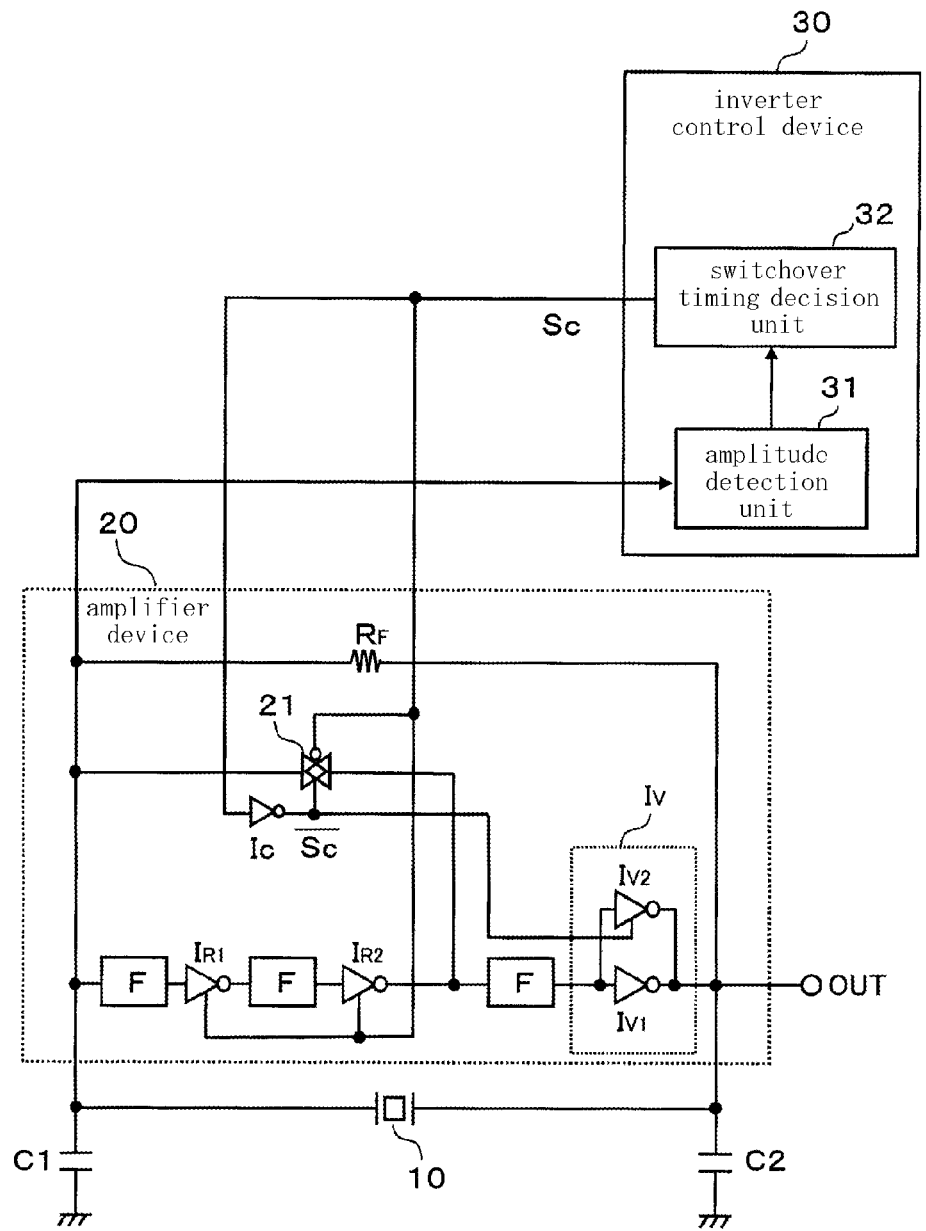
FIG. 12 is a circuit block diagram illustrating a structural characteristic of an oscillator circuit according to an exemplary embodiment 4 of the present invention.

7] To more reliably eliminate the risk of abnormal oscillation in the oscillator circuits recited in 1]-[6], a filter circuit F for regulating an oscillation frequency may be additionally provided in the inverters of the amplifier device 20 (see FIG. 12). When the amplifier device 20 is operated by the inverters in multiple stages, the negative resistance increases, improving the startup characteristics. On the other hand, the risk of abnormal oscillation is increased. The abnormal oscillation may fail to obtain an expected effect in triggering the oscillation startup. When the filter circuit F is additionally provided in the inverters, a peak of the loop gain in the oscillator circuit is obtained within the range of given frequencies. Then, the piezoelectric vibrator 10 can be oscillated within the range of given frequencies. The filter circuit F, though preferably provided in all of the inverters, may be provided in a part of the inverters. When all of the inverters are equipped with the filter circuit F, the effect thereby obtained can be maximized.

In the oscillator circuits recited in 1]-6], at least one of the inverters of the amplifier device 20 is equipped with the filter circuit F for regulating the oscillation frequency. The oscillator circuit thus configured can selectively obtain the loop gain peak within the range of given frequencies to thereby control the gain when the amplifier device 20 is operated by the inverters in multiple stages. As a result, the risk of abnormal oscillation is avoided, and the oscillation startup characteristics and operation stability can be both improved.

A specific example of 7] is described below in an exemplary embodiment 4 of the present invention.

Exemplary Embodiment 4

FIG. 12 is a circuit block diagram illustrating a structural characteristic of an oscillator circuit according to an exemplary embodiment 4 of the present invention. Describing the structural characteristic of the oscillator circuit according to the present exemplary embodiment, the oscillator circuit according to the exemplary embodiment 3 is further provided with a filter circuit F in each of the ON/OFF inverter $I_{R1}$ in the first stage, ON/OFF inverter $I_{R2}$ in the second stage, and performance-variable inverter $I_V$ in the third stage of the amplifier device 20. The filter circuit F is preferably configured of such a band pass filter that the loop gain of the oscillator circuit shows a peak within the range of given frequencies, or such a low pass filter that reduces a high frequency gain so that an overtone oscillation (mode of vibration a few times higher than basic wave) is controlled.

The present exemplary embodiment is structurally characteristic in that the inverters in multiple stages of the amplifier device 20 ($I_{R1}$, $I_{R2}$, $I_V$) are all provided with the filter circuit F. Therefore, the loop gain of the oscillation circuit shows a peak within the range of given frequencies in the initial phase of oscillation startup, and the oscillation can be generated within the range of given frequencies of the piezoelectric vibrator 10.

According to the present exemplary embodiment described so far, wherein the inverters in multiple stages of the amplifier device 20 ($I_{R1}$, $I_{R2}$, $I_V$) are all provided with the filter circuit F, the oscillator circuit can successfully avoid the risk of abnormal oscillation and improve the oscillation startup characteristics and oscillation stability. Because all of the inverters ($I_{R1}$, $I_{R2}$, $I_V$) are provided with the filter circuit F, an overall filtering effect thereby obtained can be maximized. In the case where a part of the inverters is provided with the filter circuit F, the filtering effect, though somewhat diminished, can be similarly obtained. The filter circuit F is preferably provided in at least one of the inverters.

The exemplary embodiment 4 may be applied to the exemplary embodiments 1-3.

8] A preferable example of the filter circuit F recited in 7] is a band pass filter circuit in which a low pass filter and a high path filter are combined. The low pass filter is configured of a current-regulating transistor connected to a power terminal of the inverter, and a capacitance element or a parasitic capacitance connected to an output terminal of the inverter. The high pass filter is configured of a DC-cut capacitance element connected to an input terminal of the inverter and a feedback resistor connected to between the input and output terminals of the inverter.

The oscillator circuit thus technically advantageous can effectively exercise the gain control at low and high frequencies when the inverters in multiple stages are operated, and more effectively improve the oscillation startup characteristics and oscillation stability by controlling the risk of abnormal oscillation.

A specific example of 8] is described below as in exemplary embodiment 5 of the present invention.

Exemplary Embodiment 5

Figure 13:
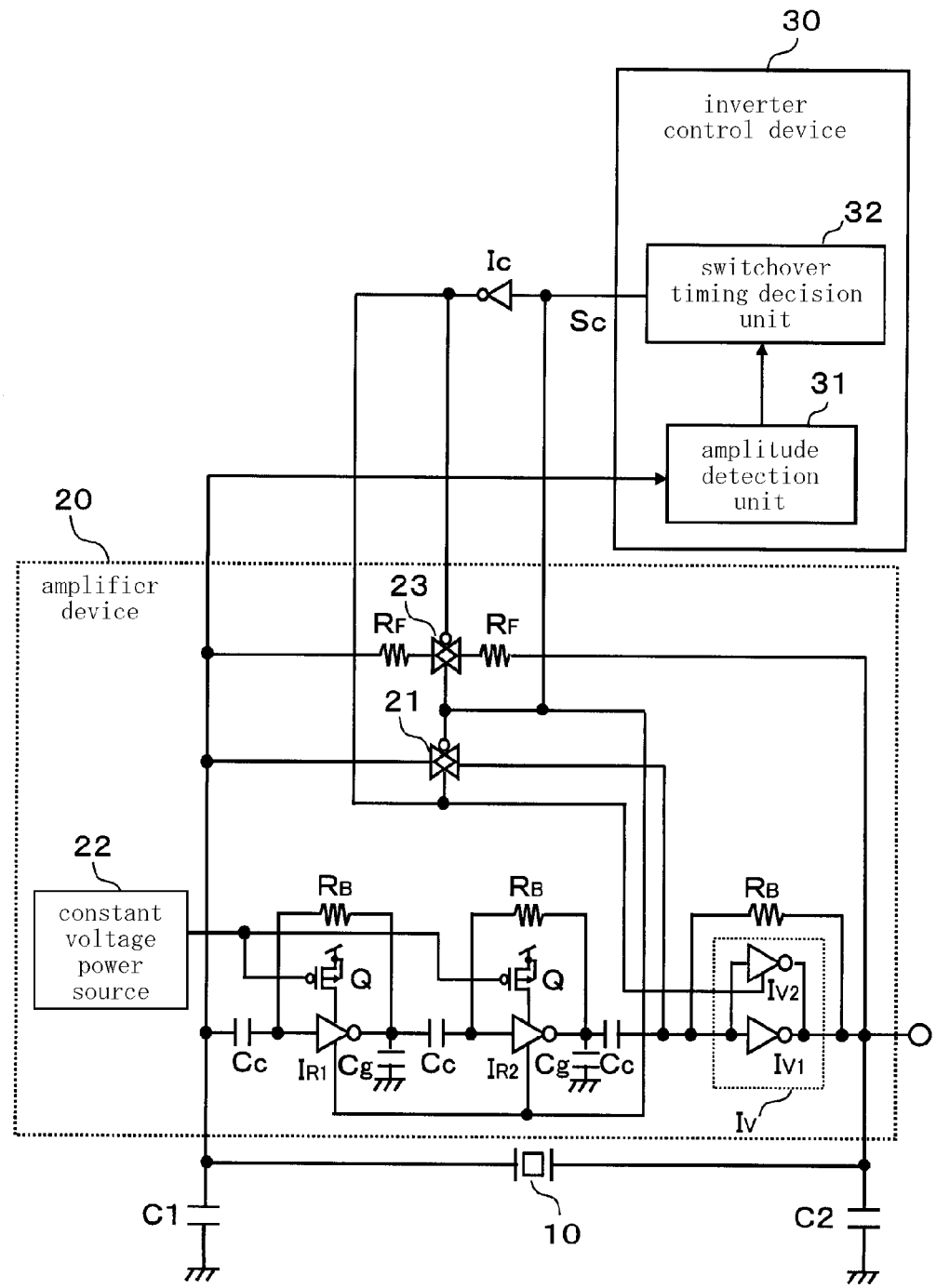
FIG. 13 is a circuit block diagram illustrating a structural characteristic of an oscillator circuit according to an exemplary embodiment 5 of the present invention.

FIG. 13 is a circuit block diagram illustrating a structural characteristic of an oscillator circuit according to an exemplary embodiment 5 of the present invention. In the present exemplary embodiment, the filter circuit F according to the exemplary embodiment 4 is configured as described below.

A current-regulating transistor Q is connected to power terminals of the ON/OFF inverters $I_{R1}$ and $I_{R2}$ in the first and second stages of the amplifier device 20, and a constant voltage power source 22 is connected to a gate of the current-regulating transistor Q. A capacitance element Cg is connected to between output terminals of the ON/OFF inverters $I_{R1}$ and $I_{R2}$ in the first and second stages and ground GND. The constant voltage power source 22, current-regulating transistor Q, and capacitance element Cg constitute a low pass filter circuit.

A DC-cut capacitance element Cc is connected to the input terminal side of the ON/OFF inverters $I_{R1}$ and $I_{R2}$ in the first and second stages. A feedback resistor $R_B$ is connected to between the input and output terminals of the ON/OFF inverters $I_{R1}$ and $I_{R2}$ in the first and second stages. The DC-cut capacitance element Cc and the feedback resistor $R_B$ constitute a high pas filter circuit.

The DC-cut capacitance element Cc is connected to the input terminal side of the performance-variable inverter $I_V$ in the third stage, and the feedback resistor $R_B$ is connected to between the input and output terminals thereof.

A feedback resistor selector switch 23 is connected in series to a feedback resistor $R_F$ between the input and output terminals of the amplifier device 20. The feedback resistor selector switch 23 is switched on and off by the switchover control signal Sc outputted from the switchover timing decision unit 32. The ON/OFF control by the feedback resistor selector switch 23 has an inverse logic to the ON/OFF control by the selector switch 21. The feedback resistor selector switch 23 is configured of a transmission gate.

One end of the selector switch 21 is connected to a connecting point of the feedback resistor $R_B$ and the DC-cut capacitance element Cc of the high pass filter circuit in the performance-variable inverter $I_V$ in the third stage. The one end of the selector switch 21 is thus connected so that the feedback resistor $R_B$ of the performance-variable inverter $I_V$ in the third stage functions in place of the feedback resistor $R_F$ when the feedback resistor selector switch 23 is switched off and the selector switch 21 is switched on in the post-startup phase. Another purpose is to prevent the DC-cut capacitance element Cc from entering enter the feedback circuit (see FIG. 14B).

The operation of the oscillator circuit according to the present exemplary embodiment thus structurally characterized is described below.

Figure 14A:
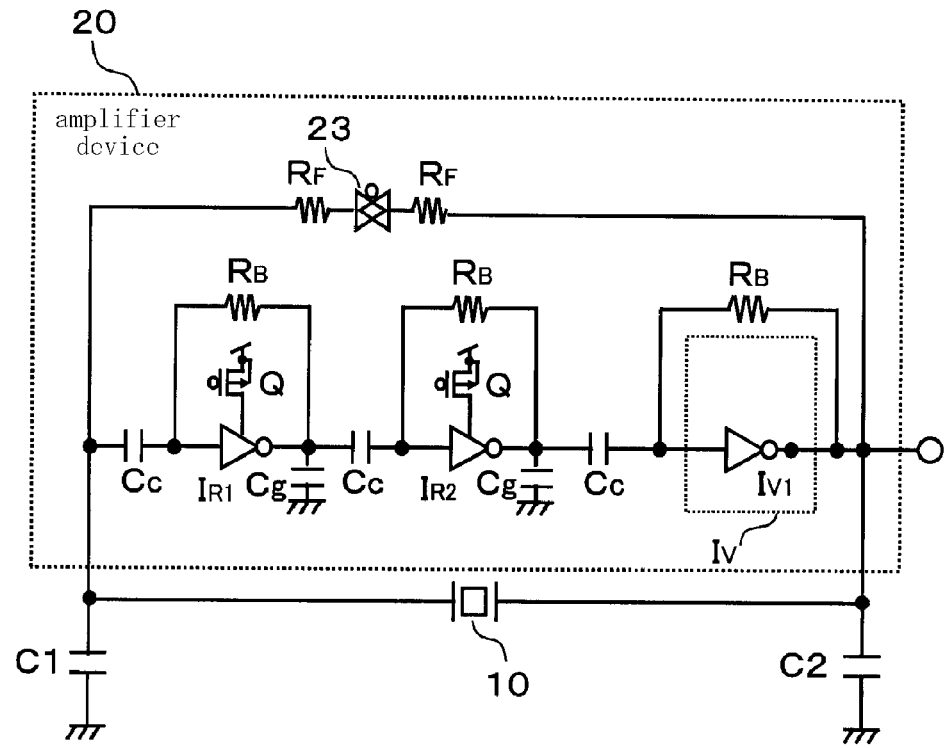
FIG. 14A illustrates a circuit configuration of main structural elements in the initial phase of oscillation startup in the oscillator circuit according to the exemplary embodiment 5.

As illustrated in FIG. 14, the selector switch 21 is OFF, and the feedback resistor selector switch 23 is ON because of the switchover control signal Sc at "H" level in the initial phase of oscillation startup. Since the selector switch 21 is OFF, the ON/OFF inverters $I_{R1}$ and $I_{R2}$ in the first and second stages are both operational as well as the performance-variable inverter $I_V$ in the third stage (second inverter $I_{V2}$ is non-operational), and the low pass filter and the high pass filter both exercise their actions. Further, the feedback resistor $R_F$ also exercises its action because the feedback resistor selector switch 23 is ON.

Figure 15:
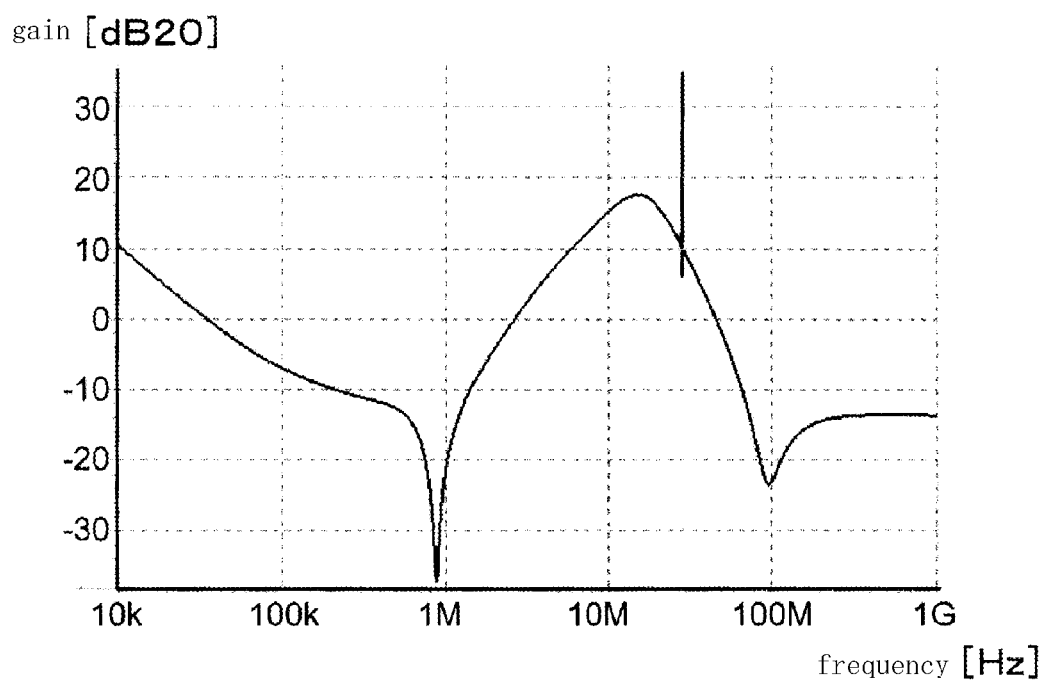
FIG. 15 is a gain-frequency characteristic chart of the oscillator circuit according to the exemplary embodiment 5.

The negative resistance increases in the initial phase of oscillation startup because of the three-stage inverter operation, achieving good oscillation startup characteristics. On the other hand, the risk of abnormal oscillation still remains. However, the high frequency and low frequency gains are controlled as compared to a resonance frequency of the piezoelectric vibrator (28.8 MHz in the present exemplary embodiment) as illustrated in FIG. 15 because the band pass filter including the high pass filter and the low pass filter is operating. As a result, the loop gain of the oscillator circuit shows a peak within the range of given frequencies. Thus, the piezoelectric vibrator 10 can be selectively oscillated within the range of given frequencies.

Figure 14B:
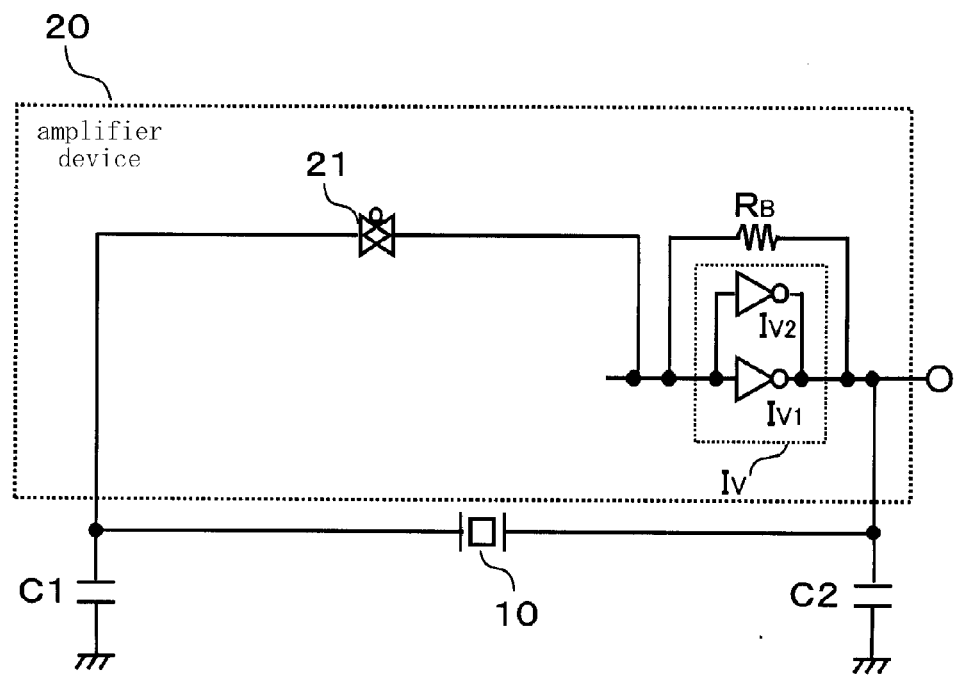
FIG. 14B illustrates a circuit configuration of main structural elements in the post-startup phase where the oscillation is stabilized in the oscillator circuit according to the exemplary embodiment 5.

In the post-startup phase, the switchover control signal Sc turns to "L" level and the feedback resistor selector switch 23 is switched off so that the feedback resistor $R_F$ is disconnected as illustrated in FIG. 14B. On the other hand, the selector switch 21 is switched on, and the ON/OFF inverters $I_{R1}$ and $I_{R2}$ in the first and second stages are disconnected. Further, the second inverter $I_{V2}$ in the third stage becomes operational, and the feedback resistor $R_B$ of the performance-variable inverter $I_V$ in the third stage becomes active in place of the feedback resistor $R_F$.

According to the present exemplary embodiment described so far, wherein the inverters of the amplifier device 20 are further equipped with the band pass filter including the low pass filter and the high pass filter, the low frequency and high frequency gains in the operation using the inverters in multiple stages can be more effectively controlled. As a result, the risk of abnormal oscillation can be more effectively avoided.

A parasitic capacitance may be used in place of the capacitance element Cg.

An exemplary embodiment 6 of the present invention describes below a preferable example of the inverter control device 30 including the amplitude detection unit 31 which inputs therein the signal of the amplifier device 20 to detect the amplitude of the inputted signal, and the switchover timing decision unit 32 which decides whether the detected amplitude equals to the given threshold value.

Exemplary Embodiment 6

Figure 16:
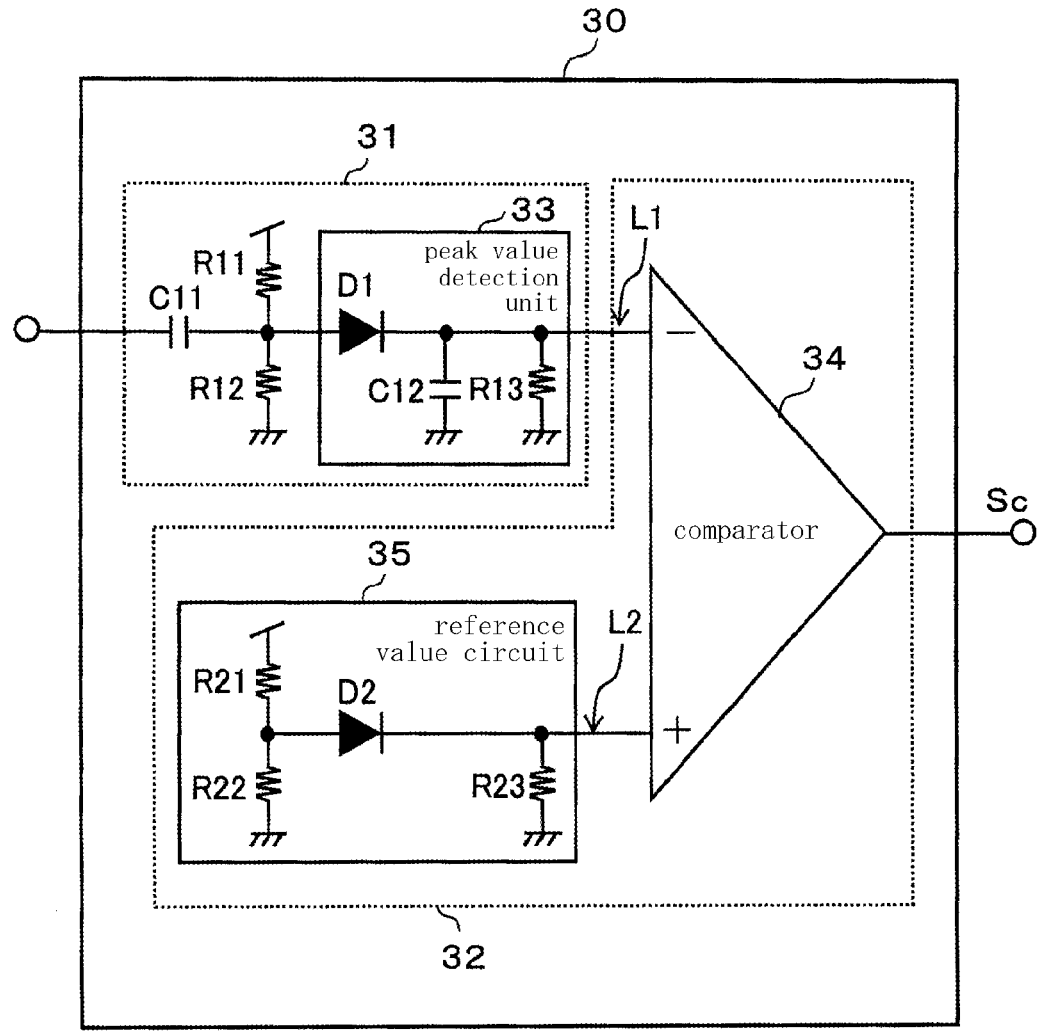
FIG. 16 illustrates a circuit configuration of an inverter control device according to an exemplary embodiment 6 of the present invention.

FIG. 16 illustrates a circuit configuration of an inverter control device according to an exemplary embodiment 6 of the present invention. A switchover timing decision unit 32 of the inverter control device 30 includes a comparator 34 having a first input path L1 and a second input path L2, and a reference value circuit 35 connected to the second input path L2 of the comparator 34. An amplitude detection unit 31 is connected to the first input path L1 of the comparator 34. The amplitude detection unit 31 includes a peak value detection circuit 33 configured of a rectifying diode D1, a charge/discharge capacitance element C12, and a discharge resistor element R13. A section of the amplitude detection unit 31 connected to the amplifier device 20 is provided with a DC-cut capacitance element C11, a resistor element R11 having an end connected to a power terminal, and a resistor element R12 having an end connected to ground. An anode of the diode D1 is connected to a connecting point of the resistor elements R11 and R12. A cathode of the diode D1 is connected to an inversion input terminal (−) of the comparator 34, and a capacitance element C12 and a resistor element R13 are connected to between the cathode and the ground.

The reference value circuit 35 connected to the second input path L2 of the comparator 34 includes a resistor element R21 having an end connected to the power terminal, a resistor element R22 having an end connected to the ground, a diode D2 having an anode connected to a connecting point of the resistor elements R21 and R22, and a resistor element R23 connected to between the ground and a cathode of the diode D2 and a non-inversion input terminal (+) of the comparator 34. The resistor elements R11 and R12 of the amplitude detection unit 31 have characteristics equal to the resistor elements R21 and R22 of the reference value circuit 35. The diode D1 and the resistor element R13 of the peak value detection circuit 35 have characteristics equal to the diode D2 and the resistor element R23 of the reference value circuit 35. The elements having the same characteristics are thus employed to lessen any impact of the variability so that the decision accuracy is improved.

Next, the operation of the oscillator circuit is described. The signal of the amplifier device 20 inputted to the amplitude detection unit 31 is DC-cut by the capacitance element C11, and the resulting signal is converted into a sine wave signal having an amplitude centered around a DC voltage generated based on a proportion of resistances of the resistor element R11 and the resistor element R12. When a voltage inputted to the diode D1 exceeds "charge voltage of the capacitance element C12+forward voltage of the diode D1", a forward current flows into the diode D1 so that the capacitance element C12 is charged. When the voltage inputted to the diode D1 equals to "charge voltage of the capacitance element C12+forward voltage of the diode D1", the diode D1 is switched off, and a peak value of the inputted signal (signal of the amplifier device 20) is detected. Thereafter, the charges of the capacitance element C12 are discharged by way of the resistor element R13. A time constant by the capacitance element C12 and the resistor element R13 is desirably larger than an oscillation frequency cycle.

Because the peak value of the signal of the amplifier device 20 is inputted to the inversion input terminal (−) of the comparator 34, there is a potential variation that follows the signal amplitude of the amplifier device 20. A constant potential is inputted to the non-inversion input terminal (+) of the comparator 34. After the oscillation started, the signal amplitude of the amplifier device 20 increases. When the voltage of the inversion input terminal (−) reaches the voltage of the non-inversion input terminal (+), the comparator 34 outputs the switchover control signal Sc at "L" level inverted from "H" level. The switchover control signal Sc is low-active.

In the case where the forward voltage of the diode D1, capacitance of the capacitance element C12, and resistance value of the resistor element C13 are variable depending on conditions of process, temperature, and voltage, there is a voltage drop variation between the first input path L1 and the second input path L2. As a result, a given timing by which the comparator 34 should output the switchover control signal Sc may be less accurate. To lessen the voltage drop variation, the reference value circuit 35 in the second input path L2 of the comparator 34 according to the present exemplary embodiment includes the diode D2 and the resistance element R23 having the same characteristics as the peak value detection circuit 33 in the second input path L1. As a result, the voltage drop variation is lessened, and variability of the logic inversion timing of the switchover control signal Sc is thereby lessened.

Figure 17:
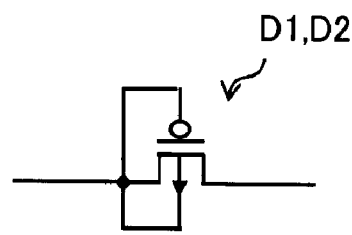
FIG. 17 is an illustration of a MOSFET-configured diode according to a modified embodiment of the exemplary embodiment 6.

As illustrated in FIG. 17, the diodes D1 and D2 may be respectively configured of a MOSFET having a gate-drain connected diode structure. The comparator 34 may be high-active.

The exemplary embodiment 6 is applicable to the oscillator circuits according to the exemplary embodiments 1-5.

Summarizing the description given so far, the oscillator circuits recited in 1]-8] are further technically characterized in that the switchover timing decision unit 32 of the inverter control device 30 includes the comparator 34 having the first and second input paths L1 and L2, and the reference value circuit 35 connected to the second input path L2 of the comparator 34, the amplitude detection unit 31 connected to the first input path L1 of the comparator 34 includes the peak value detection circuit 33 configured of the rectifying diode D1, charge/discharge capacitance element C12, and discharge resistor element R13, and the reference value circuit 35 is configured of the diode D2 and the resistor element R23 having the same characteristics as the peak value detection circuit 33.

The oscillator circuit thus structurally characterized can control the voltage drop variability between the peak value detection circuit 33 in the first input path L1 of the comparator 34 and the reference value circuit 35 in the second input path L2 of the comparator 34, and further control the variability of the logic inversion timing of the switchover control signal Sc.

10] The reference value circuit 35 recited in 9] may include a capacitance element having characteristics equal to the peak value detection circuit 33. A specific example of 8] is described below in an exemplary embodiment 7 of the present invention.

Exemplary Embodiment 7

Figure 18:
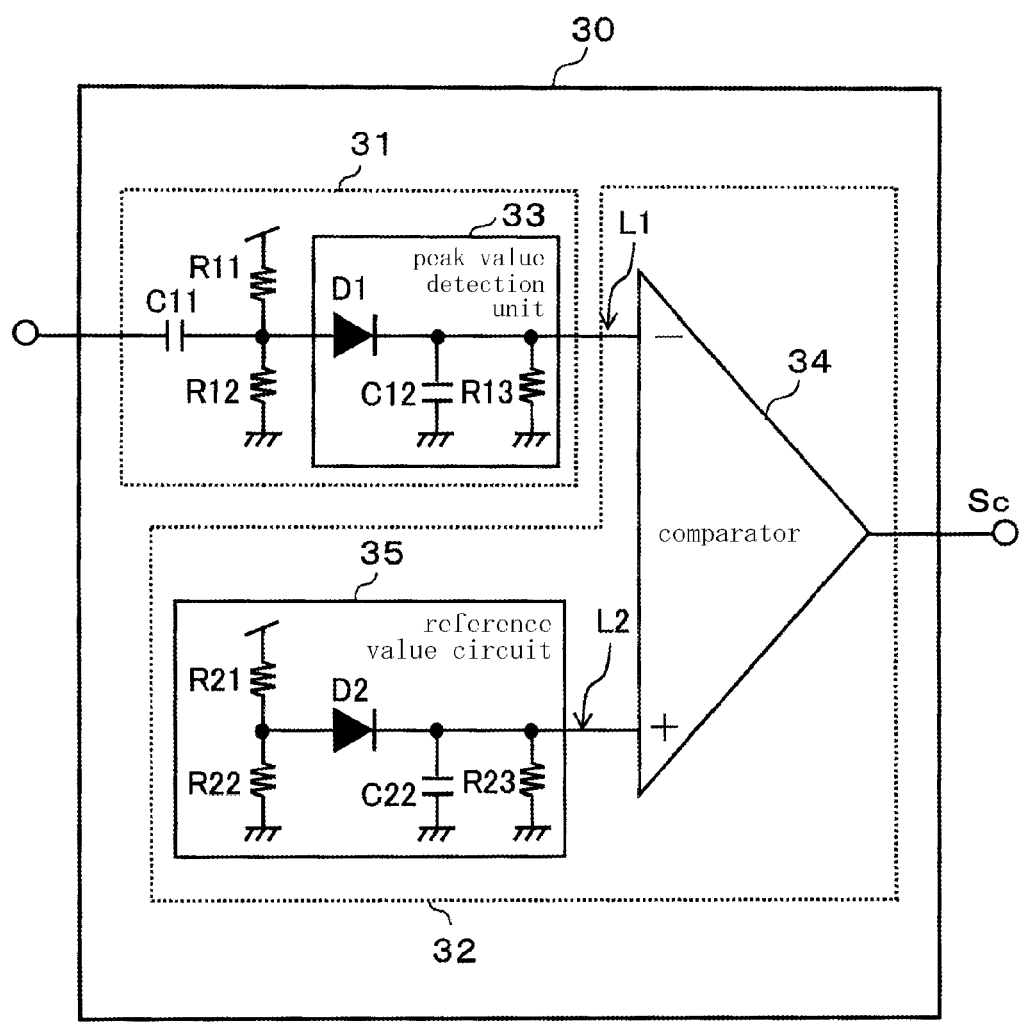
FIG. 18 illustrates a circuit configuration of an inverter control device according to an exemplary embodiment 7 of the present invention.

FIG. 18 illustrates a circuit configuration of a structural characteristic of an oscillator circuit according to an exemplary embodiment 7 of the present invention. The present exemplary embodiment is structurally different in that a capacitance element C22 having characteristics equal to the capacitance element C12 of the peak value detection circuit 33 is connected to between the diode D2 and ground GND in the reference value circuit 35 according to the exemplary embodiment 6. Any other structural elements similar to those of FIG. 16 according to the exemplary embodiment 6 are simply illustrated with the same reference symbols, and description of the similar structural elements is omitted.

By further providing the capacitance element C22 having the same characteristics as the peak value detection circuit 33, the second input path L2 is configured equivalent to the first input path L1. As a result, a potential difference variability between the inversion input terminal (−) and the non-inversion input terminal (+) of the comparator 34 can be further lessened, and the variability of the logic inversion timing of the switchover control signal Sc can be more effectively lessened.

The exemplary embodiments 1-7 described so far are suitable examples of the present invention. It is intended to cover in the technical scope of the present invention all such modifications as fall within the true spirit and scope of this invention.

INDUSTRIAL APPLICABILITY

The oscillator circuit according to the present invention is technical advantageous in; improving favorable startup characteristics (quick oscillation startup), avoiding an abnormal oscillation, reducing current consumption, and achieving noise reduction and stabilized oscillation. The application range of the oscillator circuit includes mobile telephone, automated meter reader, security and disaster control devices, and a longer battery life in any battery-driven devices.

DESCRIPTION OF REFERENCE SYMBOLS 10 piezoelectric vibrator
20 amplifier device
21 selector switch
22 constant voltage power source
23 feedback resistor selector switch
30 inverter control device
31 amplitude detection unit
32 switchover timing decision unit
33 peak value detection circuit
34 comparator
35 reference value circuit
C1 first load capacitance
C2 second load capacitance
C12, C22 charge/discharge capacitance element
Cc DC-cut capacitance element
D1, D2 rectifying diode
F filter circuit
Ic switchover control inverter
$I_{R1}$, $I_{R2}$ ON/OFF inverter
$I_V$ performance-variable inverter
$I_{V1}$ first inverter in third stage
$I_{V2}$ second inverter in third stage
Q current control transistor
$R_B$ feedback resistor
$R_F$ feedback resistor
R13, R23 discharge resistor element
Sc switchover control signal

What is claimed is:

1. An oscillator circuit comprising:
a piezoelectric vibrator;
an amplifier device connected to the piezoelectric vibrator and configured to amplify an oscillation output from the piezoelectric vibrator, the amplifier device including inverters connected in series to each other; and
an inverter control device configured to control an operational state of the inverters, wherein:
the inverters includes:
a performance-variable inverter which is operational in both of an initial phase of oscillation startup and a post-startup phase where oscillation is stabilized and is configured to carry out a variable performance depending on whether the oscillator circuit is in the initial phase of oscillation startup or the post-startup phase; and
an ON/OFF inverter which is operational in the initial phase of oscillation startup and disconnected in the post-startup phase, and
the inverter control device includes:
an amplitude detection circuit configured to detect an amplitude of a signal in any arbitrary section of the amplifier device; and
a control signal output circuit configured to generate and output a control signal which triggers operational state switchover of the inverters when the amplitude detected by the amplitude detection unit equals to a given threshold value.

2. The oscillator circuit as claimed in claim 1, wherein the inverter control device makes the performance-variable inverter and the ON/OFF inverter both operational and lowers the performance of the performance-variable inverter in the initial phase of oscillation startup, and the inverter control device disconnects the ON/OFF inverter and increases the performance of the performance-variable inverter in the post-startup phase by using the control signal.

3. The oscillator circuit as claimed in claim 2, wherein:
the amplifier device includes a selector switch used to connect or disconnect the ON/OFF inverter between input and output terminals thereof, and
the inverter control device controls connection or disconnection by the selector switch and the performance increase or decrease of the performance-variable inverter as the initial phase of oscillation startup shifts to the post-startup phase.

4. The oscillator circuit as claimed in claim 2, wherein an operation of the ON/OFF inverter disconnected from the amplifier device is suspended based on the control signal outputted from the inverter control device.

5. The oscillator circuit as claimed in claim 1, wherein the amplitude detection unit detects the amplitude of an output signal of the amplifier device.

6. The oscillator circuit as claimed in claim 1, wherein the amplitude detection unit detects the amplitude of an input signal of the amplifier device.

7. The oscillator circuit as claimed in claim 1, wherein at least one of the inverters includes a filter circuit configured to regulate an oscillation frequency.

8. The oscillator circuit as claimed in claim 7, wherein:
the filter circuit includes a low pass filter and a high pass filter, and
the low pass filter includes a current-regulating transistor connected to a power terminal of the at least one of the inverters, and a capacitance element or a parasitic capacitance connected to an output terminal of the at least one of the inverters, and the high pass filter includes a DC-cut capacitance element connected to an input terminal of the at least one of the inverters and a feedback resistor connected to between the input and output terminals of the at least one of the inverters.

9. The oscillator circuit as claimed in claim 1, wherein:
the control signal output circuit includes:
a comparator having a first input path and a second input path; and
a reference value circuit connected to the second input path of the comparator, the amplitude detection circuit includes a peak value detection circuit connected to the first input path of the comparator,
the peak value detection circuit includes a rectifying diode, a charge/discharge capacitance element, and a discharge resistor element, and
the reference value circuit includes a diode and a resistor element having characteristics equal to characteristics of the diode and the discharge resistor element of the peak value detection unit.

10. The oscillator circuit as claimed in claim 9, wherein the reference value circuit further includes a capacitor element having characteristics equal to characteristics of the charge/discharge capacitance element of the peak value detection unit.

11. An oscillator circuit comprising:
a piezoelectric vibrator;
an amplifier circuit connected to the piezoelectric vibrator and configured to amplify an oscillation output from the piezoelectric vibrator, the amplifier circuit including inverters connected in series to each other; and
an inverter control circuit configured to control an operational state of the inverters, wherein:
the inverters includes:
a performance-variable inverter which is operational in both of an initial phase of oscillation startup and a post-startup phase where oscillation is stabilized and is configured to carry out a variable performance depending on whether the oscillator circuit is in the initial phase of oscillation startup or the post-startup phase; and
an ON/OFF inverter which is operational in the initial phase of oscillation startup and is not operational in the post-startup phase, and
the inverter control circuit is configured to control the operational state of the inverters based on an amplitude of a signal in the amplifier circuit.

12. The oscillator circuit as claimed in claim 11, wherein the inverter control circuit controls the operational state of the inverters by detecting the amplitude of the signal, comparing the amplitude with a threshold value and controlling the operational state based on a comparison result.

13. The oscillator circuit as claimed in claim 11, wherein the inverter control circuit controls the operational state of the inverters by electrically disconnecting the ON/OFF inverter when the amplitude of the signal reaches a threshold value.

14. The oscillator circuit as claimed in claim 11, wherein the inverter control circuit includes:
an amplitude detection circuit configured to detect the amplitude of the signal in the amplifier circuit; and
a control signal output circuit configured to output a control signal to control connection and disconnection of the ON/OFF inverter based on the amplitude.

15. An oscillator circuit comprising:
a piezoelectric vibrator;
an amplifier circuit connected to the piezoelectric vibrator and configured to amplify an oscillation output from the piezoelectric vibrator, the amplifier circuit including inverters connected in series to each other; and
an inverter control circuit configured to control an operational state of the inverters, wherein:
the inverters includes:
a performance-variable inverter which is operational in both of an initial phase of oscillation startup and a post-startup phase where oscillation is stabilized and is configured to carry out a variable performance depending on whether the oscillator circuit is in the initial phase of oscillation startup or the post-startup phase; and
an ON/OFF inverter which is operational in the initial phase of oscillation startup and is not operational in the post-startup phase, and
the inverter control device includes:
an amplitude detection circuit configured to detect an amplitude of a signal in any arbitrary section of the amplifier device; and
a control signal output circuit configured to generate and output a control signal which triggers operational state switchover of the inverters when the amplitude detected by the amplitude detection unit reaches a given threshold value.

* * * * *